United States Patent [19]
Carrubba et al.

[11] 3,971,987
[45] July 27, 1976

[54] GAIN METHOD AND APPARATUS FOR A DELTA MODULATOR

[75] Inventors: Francis P. Carrubba, North Haven, Conn.; Peter A. Franaszek, Ossining; David D. Grossman, Yorktown Heights, both of N.Y.

[73] Assignee: International Business Machines Corporation, Armonk, N.Y.

[22] Filed: Feb. 7, 1975

[21] Appl. No.: 548,044

[52] U.S. Cl. ........................... 325/38 B; 332/11 D
[51] Int. Cl.² ..................................... H03K 13/22
[58] Field of Search ................ 325/38 B; 332/11 D; 179/15 AP, 15 BW; 178/DIG. 3

[56] References Cited
UNITED STATES PATENTS

| | | | |
|---|---|---|---|
| 3,393,364 | 7/1968 | Fine | 325/38 B |
| 3,609,552 | 9/1971 | Limb et al. | 325/38 B |
| 3,628,148 | 12/1971 | Brolin | 325/38 B |
| 3,699,566 | 10/1972 | Schindler | 340/347 AD |
| 3,815,033 | 6/1974 | Tewksbury | 329/104 |
| 3,878,465 | 4/1975 | Stephenne et al. | 325/38 B |
| 3,916,314 | 10/1975 | Franaszek et al. | 325/38 B |

OTHER PUBLICATIONS
IBM Technical Disclosure Bulletin vol. 15, No. 10 Mar. 1973, pp. 3168–3169 "Adaptive Delta Modulator With Variable—Sample Rate"—C. K. Jones, L. E. West.

Primary Examiner—Robert L. Griffin
Assistant Examiner—Marc E. Bookbinder
Attorney, Agent, or Firm—Jack M. Arnold

[57] ABSTRACT

In a delta modulator a sequence of code symbols are generated which are indicative of increments of signal level, with each code symbol being determined in accordance with the difference in signal level between an input signal and a prediction signal which is a representation of the input signal. A sequence of the generated code symbols are stored, including the most recent code symbol and a preceding number of code symbols, with the pattern of code symbols at any instant defining a state of signal activity. There is a table of delta increments, a table of threshold values, and a digital gain logic network, all of which provide signal outputs which are controlled by the state of signal activity represented by the stored code signal pattern. The signal output from the delta table and the threshold table are modified an amount determined by the value of the signal output from the digital gain logic network. An accumulation of modified delta increments are summed with modified threshold values for providing the prediction signal. The prediction signal and the input signal are compared for generating a new code symbol.

4 Claims, 47 Drawing Figures

ENCODER

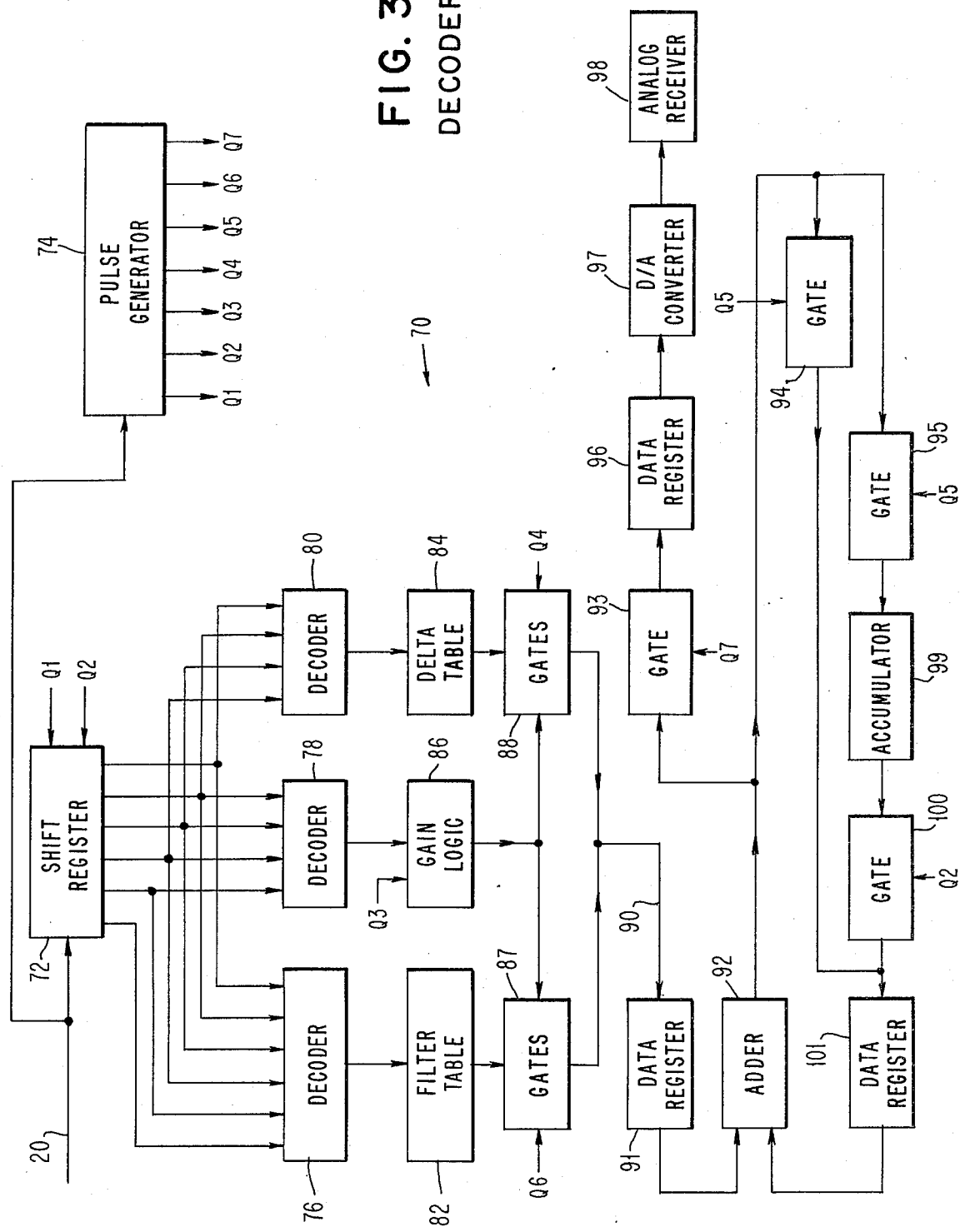

FIG. 5
| FIG. 5B | FIG. 5A |
|---|---|
| FIG. 5C | FIG. 5D |
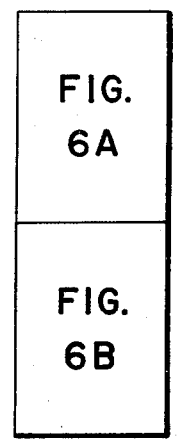
FIG. 6
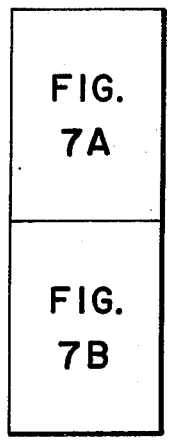
FIG. 7
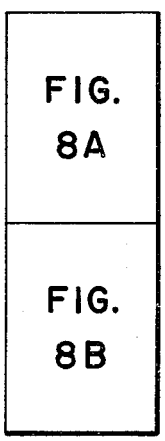
FIG. 8
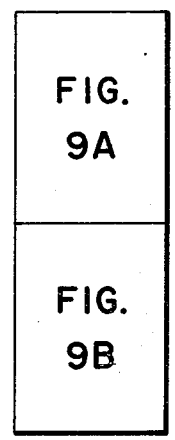
FIG. 9
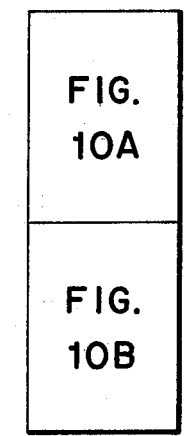
FIG. 10
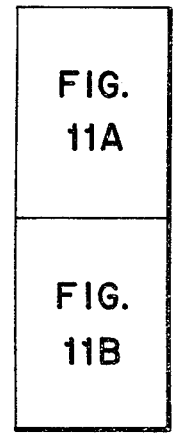
FIG. 11
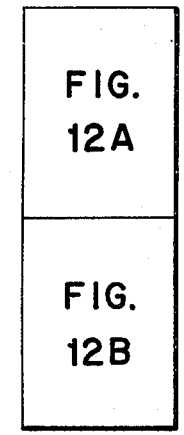
FIG. 12
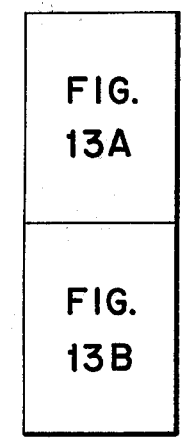
FIG. 13

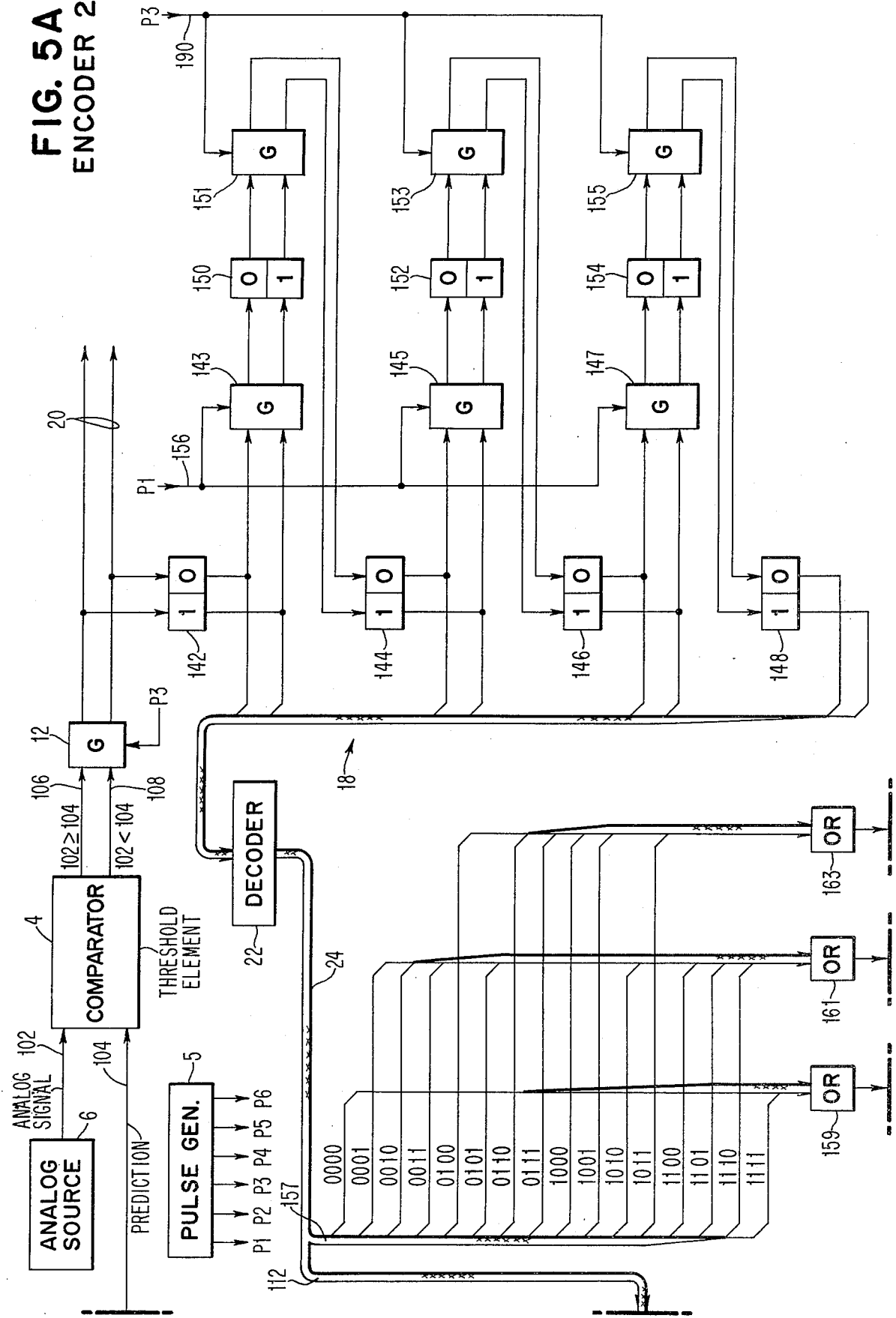

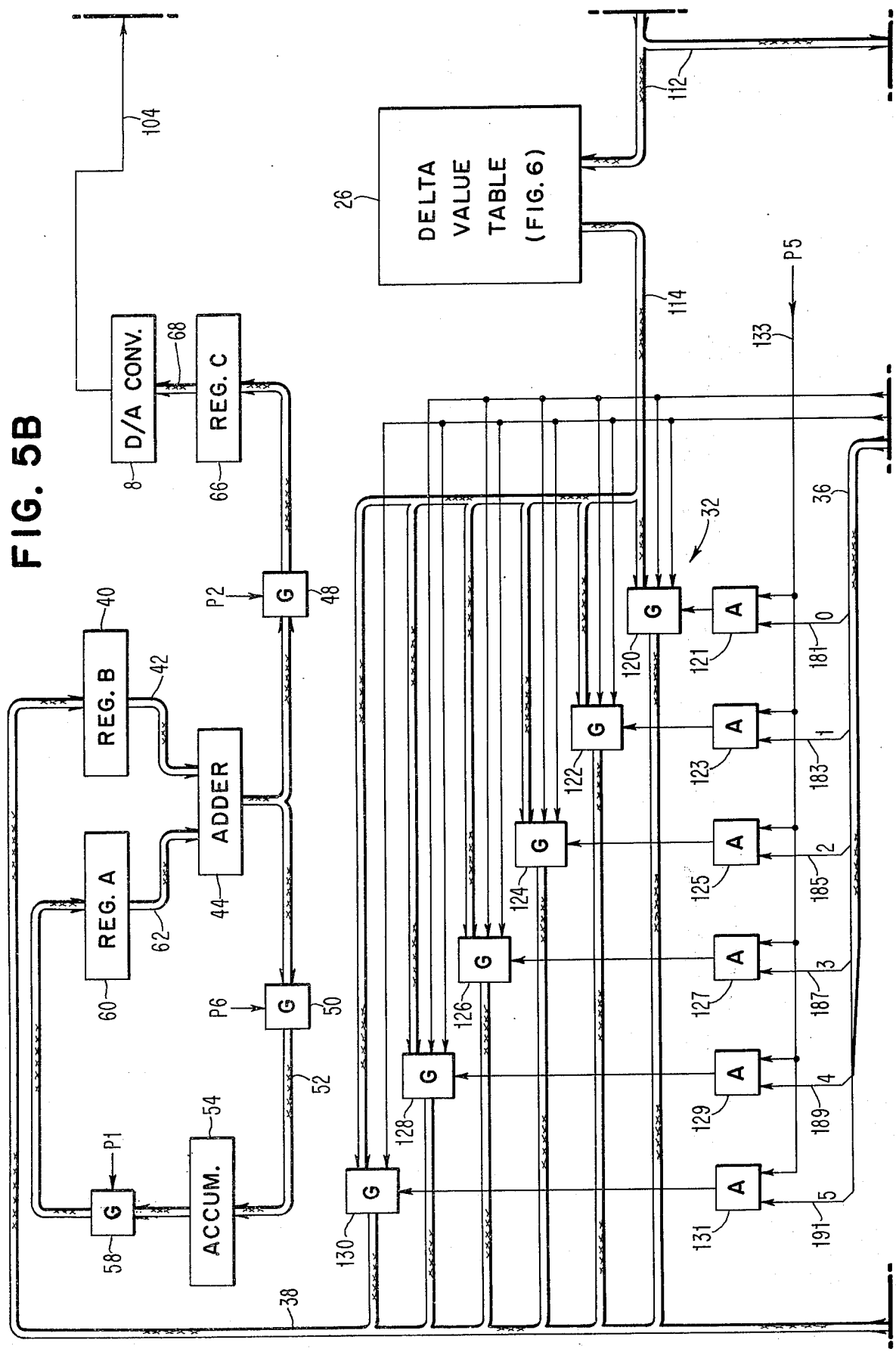

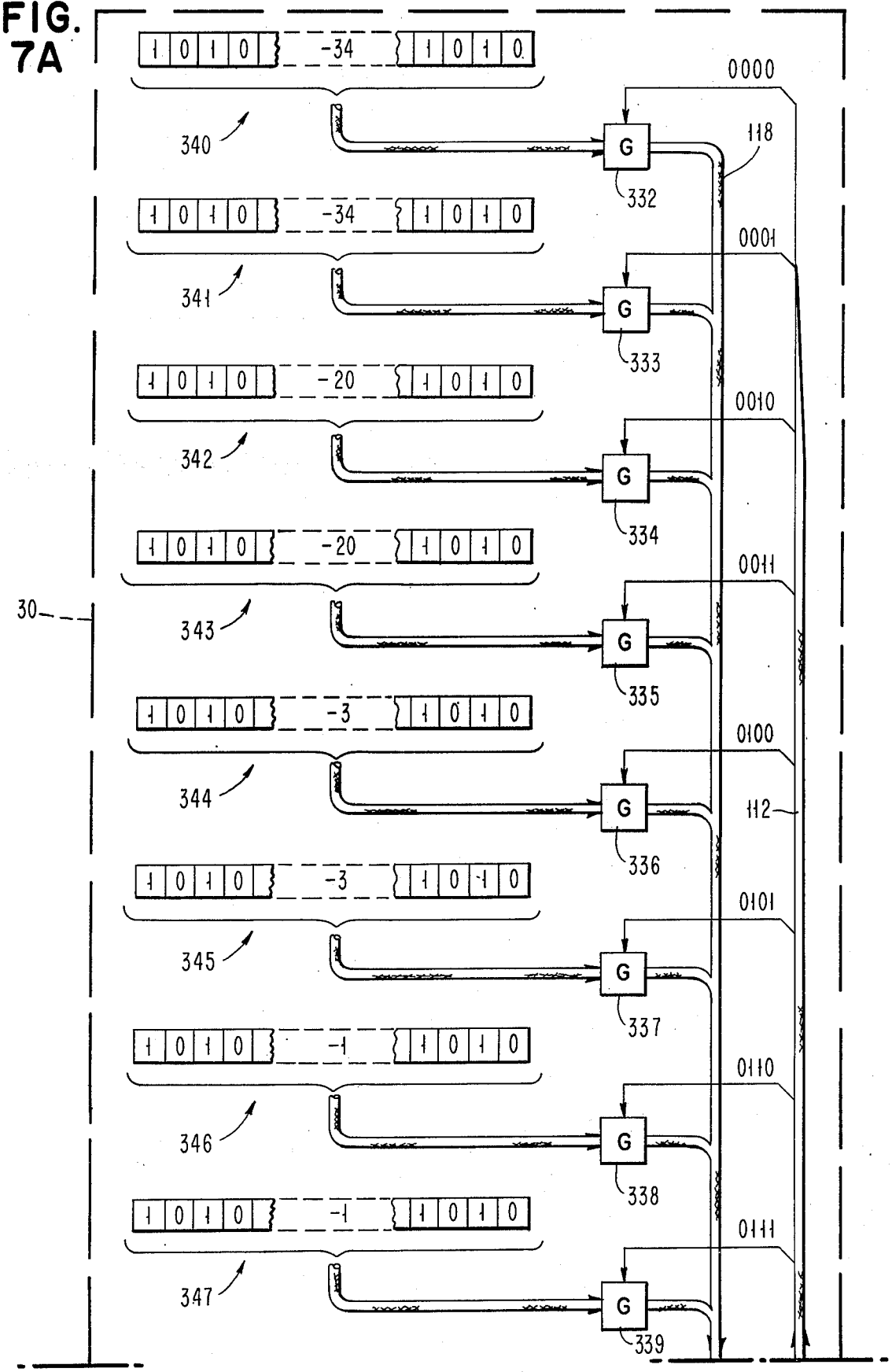

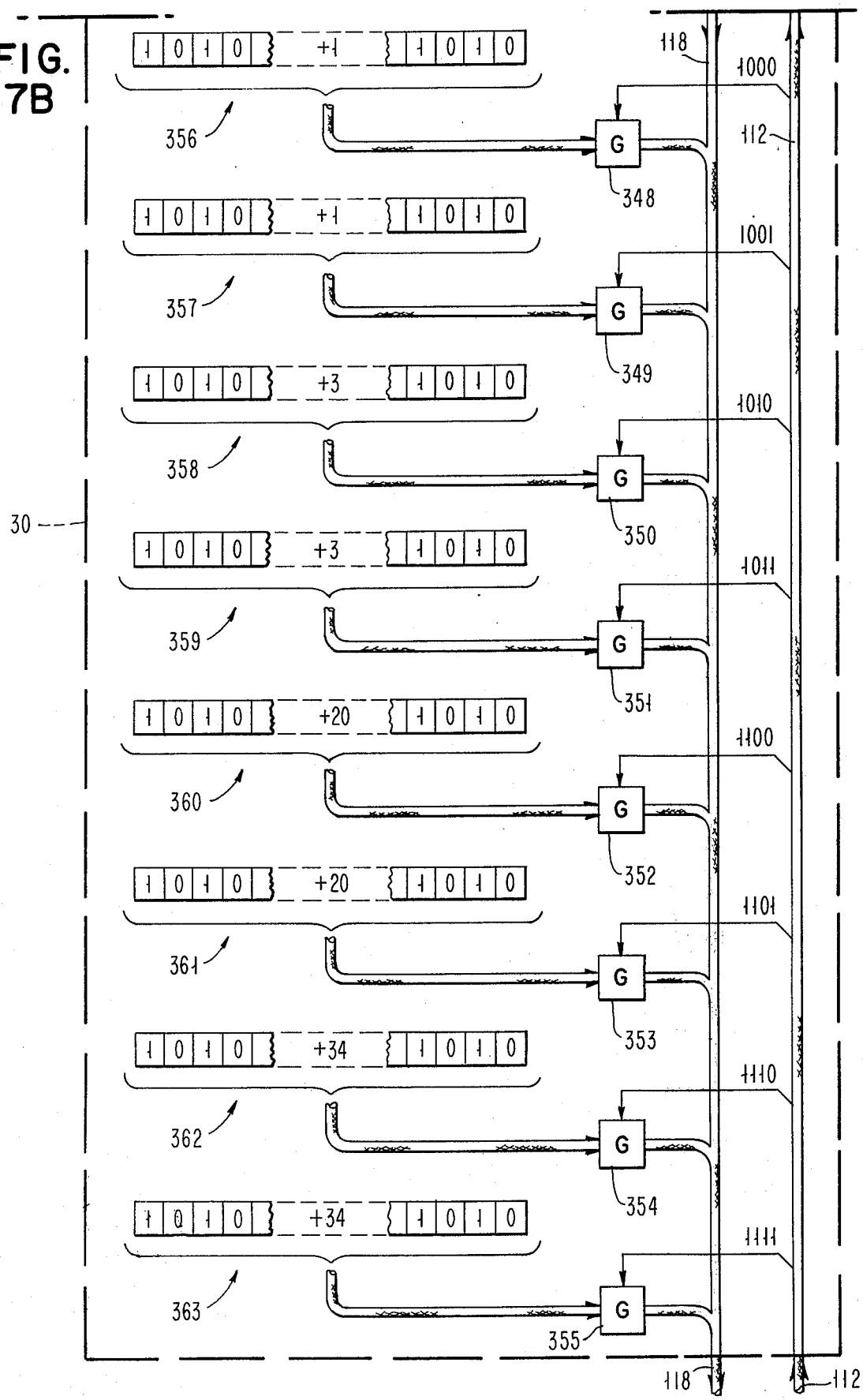

SHIFT 0 GATE

SHIFT 1 GATE

SHIFT 2 GATE

SHIFT 3 GATE

SHIFT 4 GATE

SHIFT 5 GATE

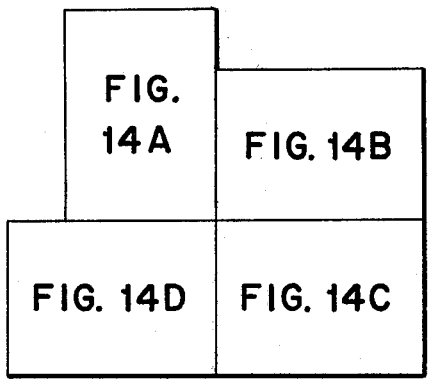

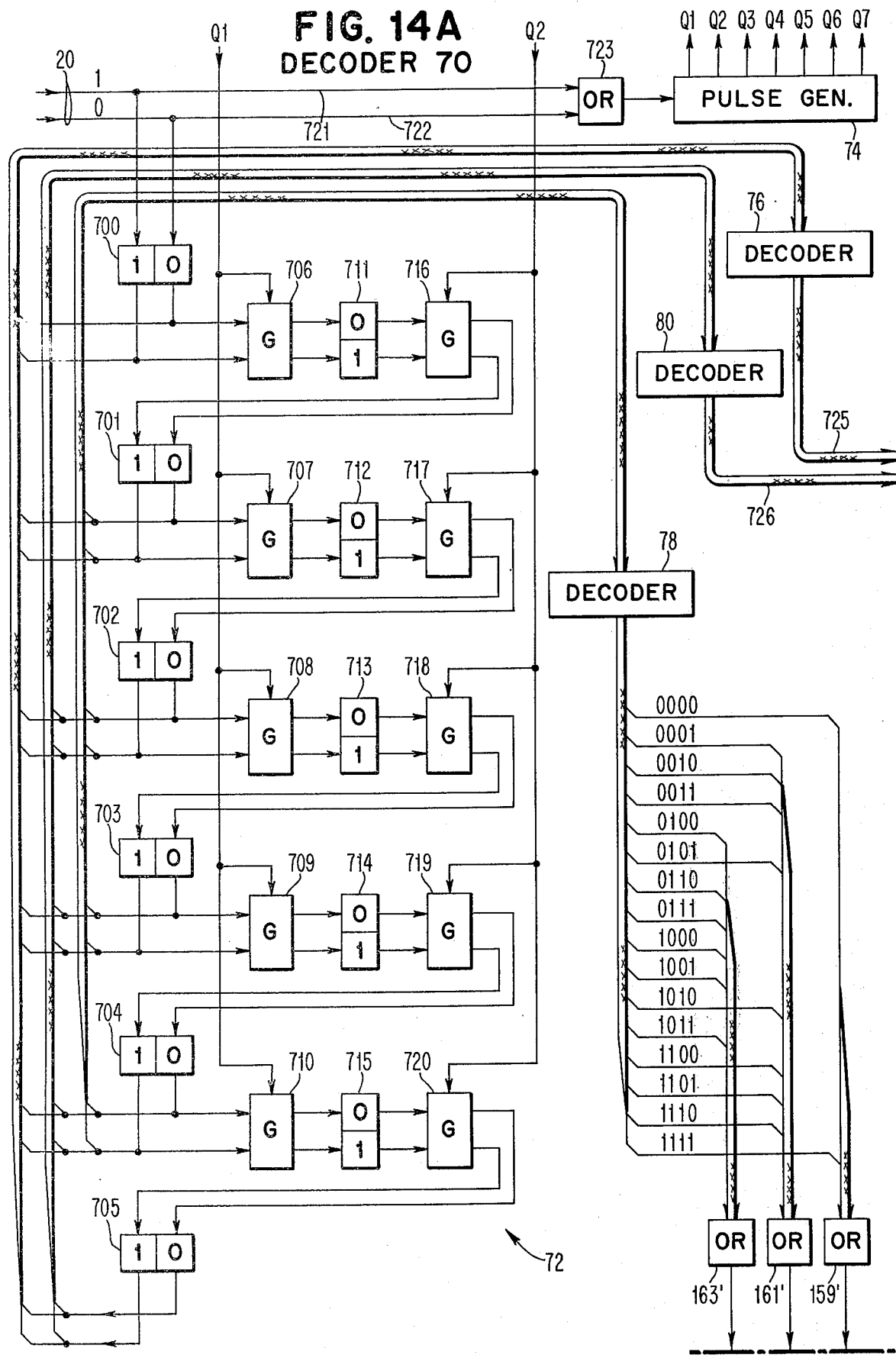

GAIN METHOD AND APPARATUS FOR A DELTA MODULATOR

BACKGROUND OF THE INVENTION

Many linear or fixed step size delta modulators experience difficulty in following sudden variations in input signal amplitude. Whenever an abrupt transition from one amplitude to a much different amplitude occurs, it takes a given length of time for the differential encoding process to integrate to a corresponding change in the encoded representation of the signal. This condition is known technically as "slope overload," and arises from the fact that in conventional delta modulators, there are certain practical limitations upon the size of the increments by which the amplitude of the reconstructed waveform is changed from one sample time to the next. If the increment is made small, the modulator responds slowly to steep transitions in the amplitude of the input signal waveform, thereby introducing phase shifts and other distortions into the reconstructed signal waveform. On the other hand, if the increment is made large enough so that the encoding process immediately starts to follow a very steep and prolonged transition of the input signal amplitude, then, with the same large increment, the system becomes unstable and shows a tendency to overshoot and oscillate when the transition peak is reached. Also, an undesirable amount of granular noise may be generated during intervals when the input signal amplitude is constant or only slightly varying. Certain delta modulators, which are called adaptive delta modulators, provide a differential encoding increment of adjustable size which is small at times when the system is idling and larger at times when the signal amplitude is varying rapidly. In some prior art delta modulators there is a fixed threshold value to which the dalta increments are compared for determining the amount the new prediction signal is changed, while in other delta modulators the threshold value is a state dependent value, as is a delta increment. In the latter type delta modulator, a new threshold value is chosen at each sample time, as is the delta increment. One such delta modulator is disclosed in U.S. Pat. No. 3,628,148 issued in the name of Steven J. Brolin. In the Brolin patent the number of available delta increments and the number of available threshold values are determined by the number of stages in the input storage register in which the respective code symbols are stored. To increase the number of available delta increments and available threshold values, the number of stages in the storage register must be increased and accordingly the size of the delta increment table and threshold table must be increased. In such a system, to have available an optimal number of threshold values and delta increments, the number of circuits and logic elements increase accordingly, resulting in an increase in the cost and size of the delta modulator.

According to the present invention, a delta modulator is disclosed which also utilizes a table of threshold values as well as a table of delta increments, which respond to stored code symbols for selecting threshold values and delta increments. An optimal number of delta increments and threshold values are available, not by utilizing more storage stages and larger tables, but rather by using a modifying network which consists of an integer arithmetic digital gain logic circuit which also responds to the stored code symbols for providing a modifying signal which modifies the selected delta increment and the selected threshold value, thereby in effect increasing the effective size of the respective tables, while minimizing the increase in circuits and logic elements and accordingly the attendant cost of such elements.

SUMMARY OF THE INVENTION

According to the present invention, a delta modulator is disclosed which includes method and apparatus for generating code symbols representing increments of signal level, with each code symbol being determined in accordance with the difference in signal level between an input signal and a prediction signal which is a representation of the input signal, with the prediction signal being formed by accumulation of successive signal level increments which depend on the history of the code symbols. There is means for storing a sequence of generated code symbols, the sequence including the most recent code symbol and a given number of preceding code symbols, with the pattern of code symbols at any instant defining a state of signal activity. There is also means for producing three signals in accordance with the state of signal activity represented by the stored code symbol pattern, namely an incremental signal level, threshold value and a modifier signal. Also included is means for modifying the incremental signal level and the threshold value an amount determined by the modifier signal. Finally, there is means for forming a new prediction signal by accumulation of successive modified signal level increments which are summed with successive modified threshold values, including means for generating a new code symbol in response to comparing the new prediction signal with the input signal.

BRIEF DESCRIPTION OF THE DRAWINGS

FIG. 3 is a block diagram representation of the decoder section of the delta modulator according to the present invention.

FIGS. 5A, 5B, 5C and 5D, taken together as shown in FIG. 5, illustrate a more detailed showing of the encoder section of the delta modulator according to the present invention.

FIGS. 6A and 5B taken together as shown in FIG. 6 is a block diagram representation of the delta value table illustrated in FIG. 5C.

FIGS. 7A and 7B taken together as shown in FIG. 7 is a block diagram representation of the threshold table illustrated in FIG. 5D.

FIGS. 14A, 14B, 14C and 14D taken together as shown in FIG. 14 is a more detailed block diagram representation of the decoder section of the delta modulator according to the present invention.

DESCRIPTION OF THE PREFERRED EMBODIMENT

The delta modulator according to the present invention is set forth in digital hardware form, it is to be appreciated however that the present invention may be practiced through the use of a properly programmed general purpose digital computer, or by other suitable techniques.

Figure 1:
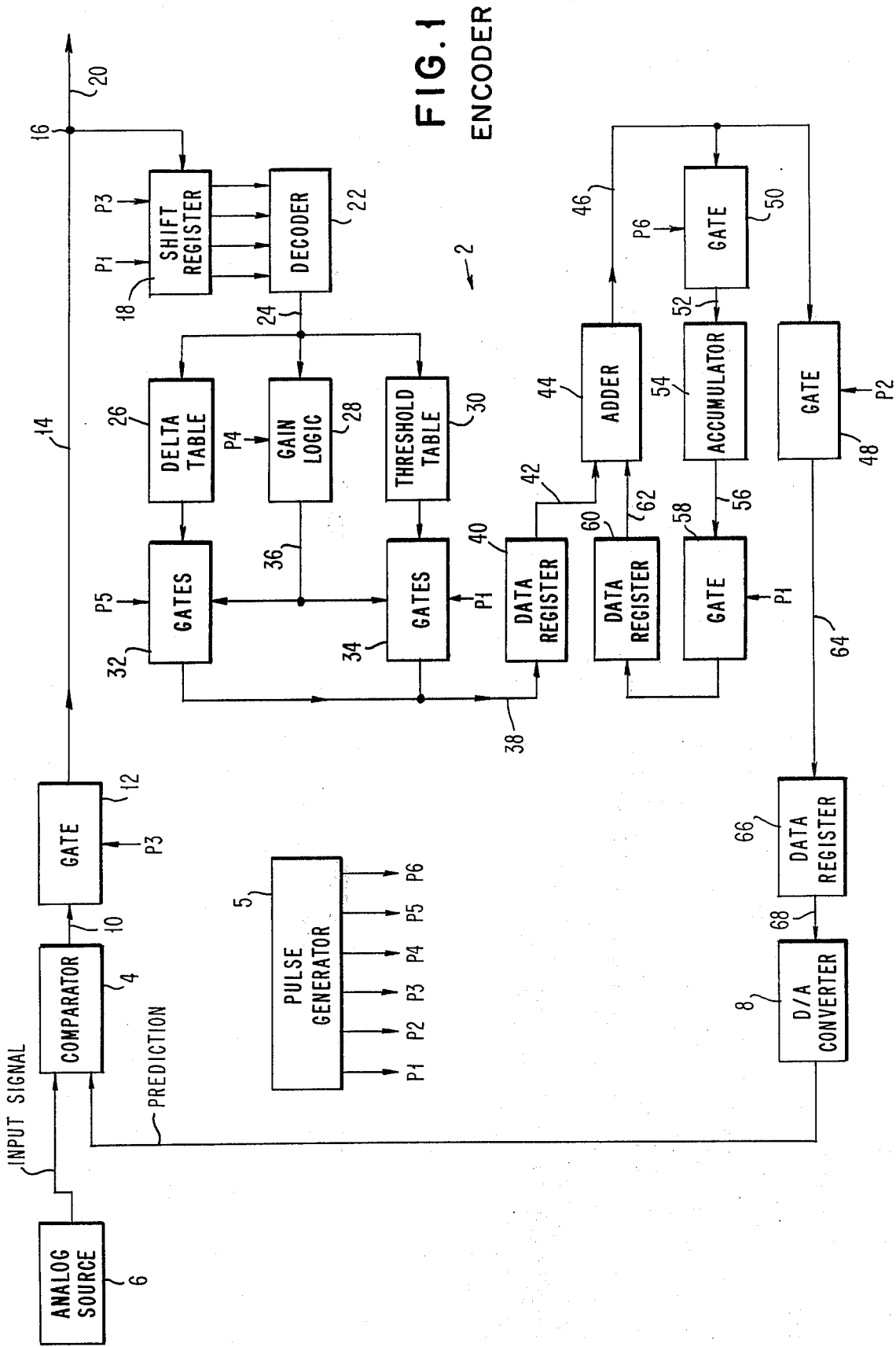
FIG. 1 is a block diagram representation of the encoder section of the delta modulator according to the present invention.

In FIG. 1, an encoder for the delta modulator is illustrated generally at 2. A comparator 4 receives an analog input from an analog source 6, and a prediction signal, which is a representation of what it is anticipated the input signal is to look from one sample time to the next, from a D/A converter 8. For description purposes only, it is assumed that the analog input signal is an audio signal. However, those skilled in the art will appreciate that other signals such as video signals, for example, may be used in the practice of the present invention. The output signal from the comparator 4 on an output line 10 is a code symbol which has a first binary value, for example a binary 1, when the signal appearing on the analog input signal line is greater than or equal to the value of the prediction signal appearing on the other input line. Conversely, if the analog input signal has a level which is less than the prediction signal, a code symbol signal indicative of a binary 0 value appears on the output line 10. In practice, the code symbol from the comparator 4 appearing on the line 10 may be represented by a pulse or no-pulse condition, a positive pulse or negative pulse condition, or by a double rail type system wherein there is a first output line and a second output line from the comparator, with a pulse being present on the first output line when there is a binary 1 condition sensed by the comparator 4, and conversely there being a pulse output on the second line when there is a binary 0 condition sensed by the comparator 4. A gate 12 passes the appropriate binary 1 or 0 code symbol indication to an output line 14, with this signal being provided to an output terminal 16 and to the input of a shift register such as the storage register 18. The code symbol signal indication appearing at the terminal 16 is provided to an output line 20 and from there to delta modulator decoder apparatus which is illustrated in FIG. 3.

The storage register 18 includes a predetermined number of stages and, by way of example only, the storage register is chosen to have four stages, with the stored binary bit pattern at any instant defining a state of signal activity relative to the input signal. The output from the storage register 18 is applied in parallel to a decoder apparatus 22 which decodes the message stored in the storage register 18 and provides on one of 16 output lines shown at 24, a signal indicative of the present state of signal activity. The output of the decoder 22 is provided on the line 24 to the respective inputs of a delta taable 26, a gain logic network 28, and a threshold table 30.

The delta table 26 is a table look-up device such as a read-only memory in which there are stored 16 integer values which may be positive or negative numbers in 2's complement form and which values are addressed by the output of the decoder 22. At any given sample time one of the values is selected in response to the decoded message and applied to the input of a plurality of gates which is illustrated generally at 32. As is known in the art, the delta increments selected from the table 26 are accumulated and form in part the prediction signal which is applied to the input of the comparaator 4. This is to be described in more detail shortly.

The threshold table 30 is another look-up device containing 16 integer values which may be positive or negative numbers 2's complement form and which are addressed by the decoder 22, with the selected integer value output from the table 30 being applied to the input of a plurality of gates which are illustrated generally at 34. The integer value output from the threshold table 30 is subsequently used as a threshold or reference level to which the successive accumulated delta increments are added for forming the prediction signal.

Figure 5C:
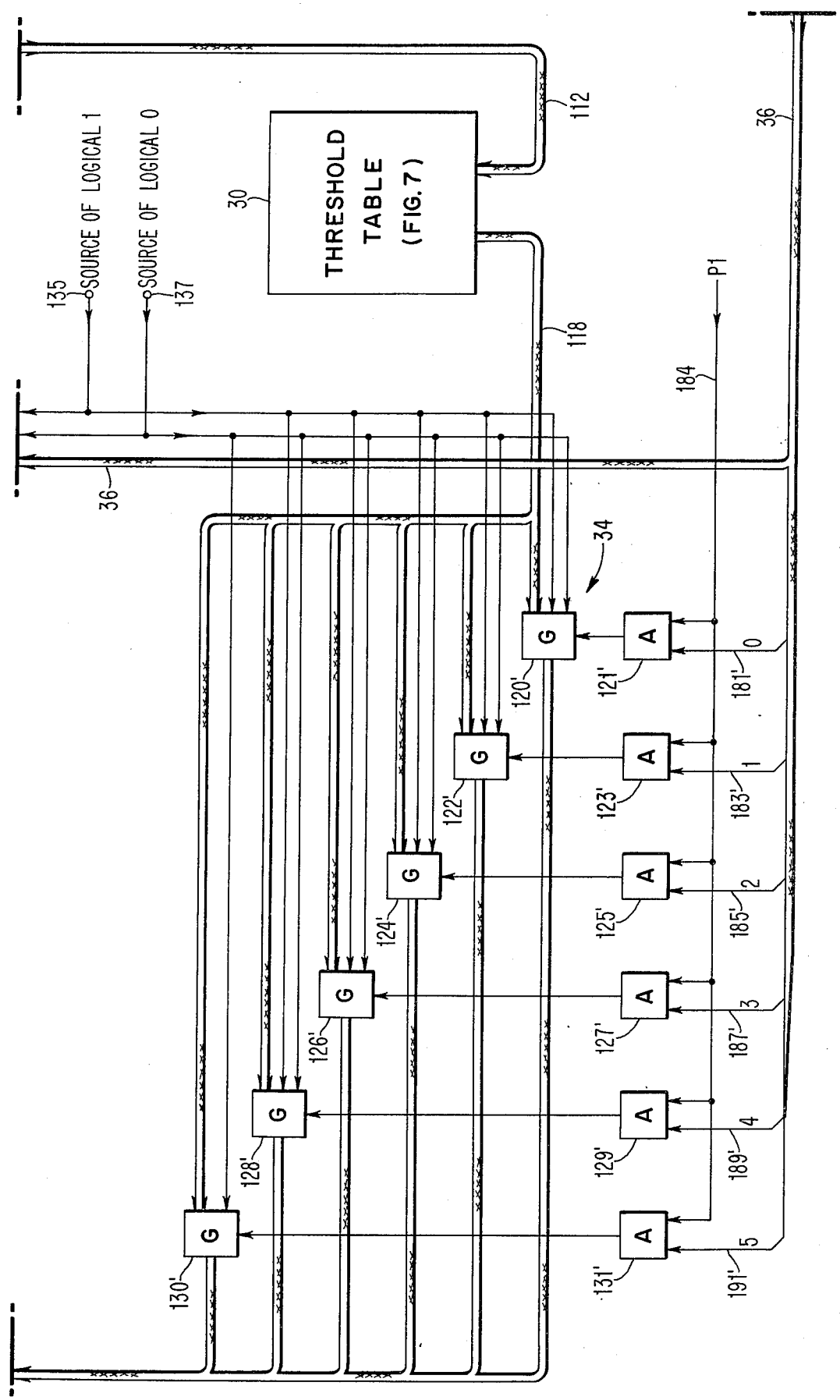
Figure 5D:
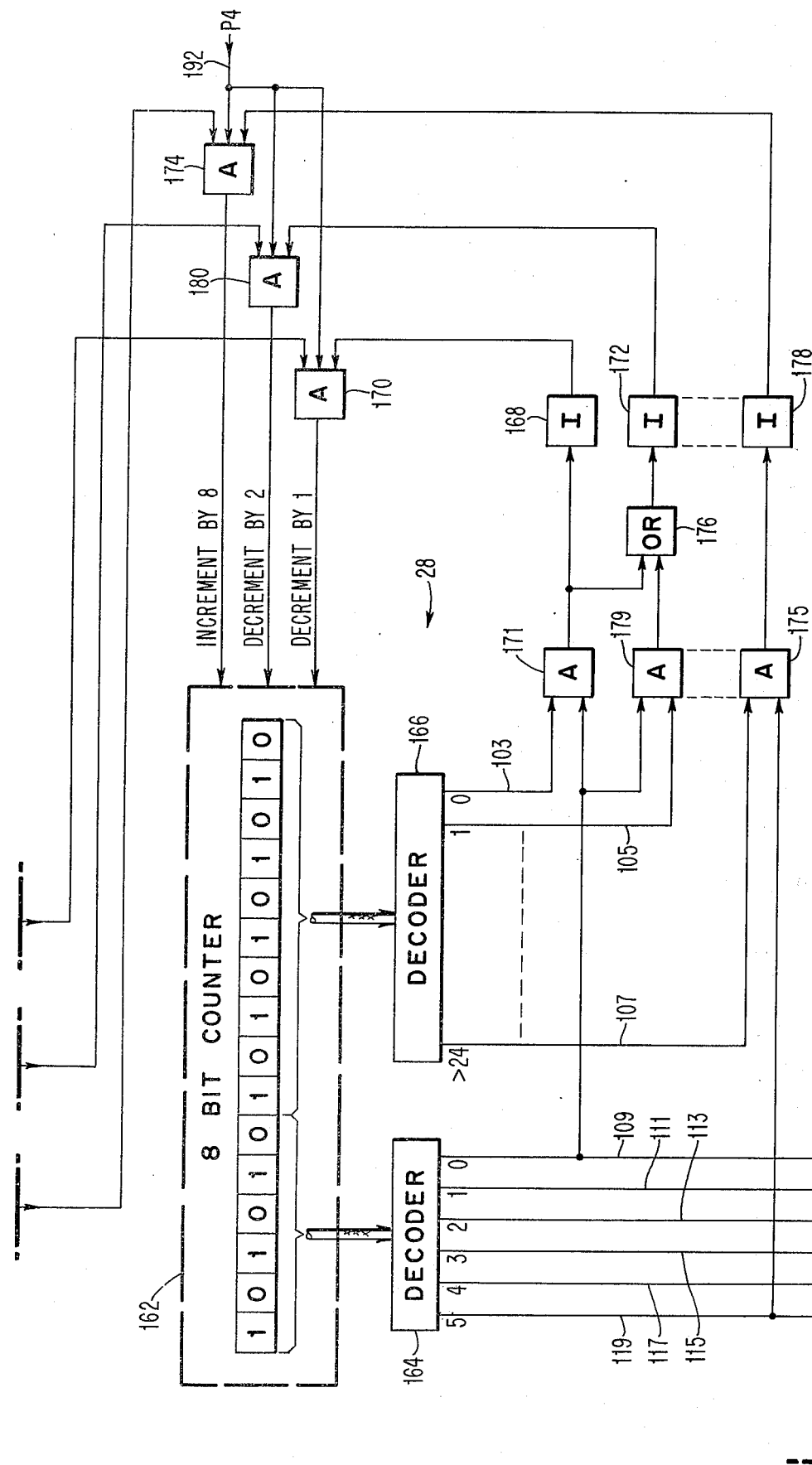

The gain logic network 28 is comprised of an 8-bit counter and two decoder networks, the function of which is described relative to FIG. 5D. The gain logic network 28 responds to the decoded message from the decoder 22 and in response thereto provides a modifier signal on an output line 36 which is used to modify the selected delta increment and the selected threshold value. This modifier signal may be, for example, a multiplier signal which multiplies the selected delta increment value and the selected threshold valve by an integer amount dependent upon the state of signal activity represented by the output of the decoder 22. In the embodiment set forth, the integer values used in the multiplication process may be 1, 2, 4, 8, 16, or 32. The gain logic network 28, therefore, functions to expand the available values from the tables 26 and 30 while minimizing the number of required logic networks and space required in the encoding device.

The respective outputs from the gates 32 and 34 are applied, at selected time intervals, via line 38 to the input of a data register 40, with the data register at one time period storing the modified delta increment, and at another time period, storing the modified threshold value. The timing sequence provided by the pulse generator 5 is desccribed shortly. The output from the data register 40 is applied via a line 42 to the first input of an adder 44, with the output of the adder 44 being applied via a line 46 to respective first inputs of a gate 48 and a gate 50. The gate 50 provides on an output line 52 the respective summed modified delta increments which are applied to the input of an accumulator 54, with the accumulated modified delta increments being applied via an output line 56 to the input of a gate network 58, with the gate 58 passing the accumulated modified delta increments to the input of a data register 60 which applies the accumulated modified delta increments to a second input of the adder 44 via a line 62. It is seen that the adder 44, therefore, sums the previous accumulated modified delta increments with the new modified delta increment and the new modified threshold value. The gate 48 passes the successive modifed delta signal level increments which have been summed with the successive modified threshold values and applies this digital signal via a line 64 to an input of a shift register 66 which applies this signal via a line 68 to the input of a D/A converter 8 for providing the analog prediction signal, which is a representation of the input signal, to the second input of the comparator 4 for comparison with the input signal.

Figure 2:
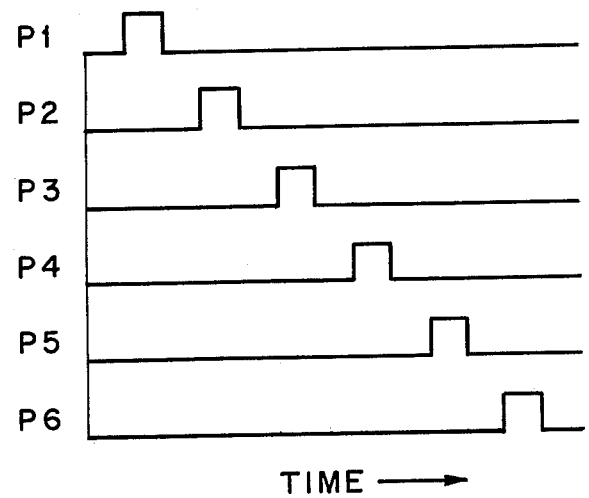
FIG. 2 is a timing diagram which is useful in understanding the operation of the encoder set forth in FIG. 1 and FIG. 5.

Refer now to FIG. 2 which is a timing diagram which sets forth the timing sequence for the encoder 2 illustrated in FIG. 1. For system initialization conditions assume that the gain logic network 28 provides a signal output calling for maximum multiplication of the delta increment and the threshold increment, namely a value of 32. Also, assume that the accumulator 54 has stored therein the maximum negative number. The maximum gain from the network 28 and the maximum accumulated negative number from the accumulator 54 is chosen such that the encoder 2 rapidly integrates towards the value of the input signal, since the level of the prediction signal initially lags the level of the input signal. At pulse P1 time, the shift register 18 is pulsd to shift the presently stored message into the temporary storage stages. At this time the message stored is all zeros, 0 0 0 0. The gates 34 also are sampled for determining the amount the present threshold value is to be multiplied. When there is a state of signal activity represented by all zeros, the gain logic network is incremented by a count of 8, as will be described in more detail shortly, and accordingly the selected threshold value which at this time is −34 (FIG. 7A, register 340), is multiplied by the factor 32 and applied to the input of the data register 40 and from there to the input of the adder 44. This signal is then added with the present accumulated sum from the accumulator 54 and the new signal appearing on the output line 46 is the old accumulation plus the modified threshold value which is passed by the gate 48 at pulse P2 time to the data register 66 and to the D/A converter 8 for forming the new analog prediction signal which is applied to the second input of the comparator 4 for providing a new code symbol, namely a binary 1 signal output on the line 10 to the input of the gate 12. It is assumed that the signal is a binary 1 level since it takes a finite amount of time for the level of the prediction signal to catch up with the level of the input signal. At time P3 the gate 12 is sampled and the binary 1 code symbol signal indication is manifested on the output line 14, is applied to the terminal 16 and in turn to the input of the storage register 18, with this signal being stored in the first stage of the shift register at P3 sample time. At pulse P4 time, the gain logic network 28 responds to the decoded message from the decoder 22 and in responce thereto the 8-bit counter is decremented by 2, due to the binary condition 0 0 0 1 as is explained in more detail shortly, and the resultant new modifier signal is applied to the gates 32 and 34, respectively. At pulse P5 time, the gate 32 has the selected delta increment multiplied by the multiplication factor from the gain logic network 28 and this modified delta increment signal is applied to the data register 40 and in turn to the first input of the adder 44 for addition with the previous accumulated modified delta increments. At P6 time the output of the adder 44, which is the sum of the accumulated modified delta increments and the new modified delta increment, is passed to the input of the accumulator 54 by way of gate 50. It is to be noted at this time that the accumulated modified delta increments are passed to the accumulator 54 rather than being passed by the gate 48 to the data register 66 and the D/A converter 88. This is so since the accumulated modifed delta increments are summed with the selected modified threshold value prior to being converted to the prediction signal. It is seen, therefore, that the modified delta increments are accumulated, and therefore are cumulative in nature, whereas the selected modified threshold values are not accumulated, but are used as a reference value from one sample time to the next. The operations performed by the adder and accumulator are all done by 2's complement arithmetic. The cycle just described keeps repeating for the duration of system operation.

Refer now to FIG. 3 which is a block diagram representation of the decoder portion of the delta modulator, and which decoder is illustrated generally at 70. The generated code symbols from the encoder 2 as manifested on the line 20 are provided to the respective inputs of a shift register such as the storage register 72, and a pulse generator 74, which provides timing for the decoder in synchronization with the received code symbols. The storage register 72 is, for purposes of illustration only, illustrated as a six-stage shift register, with the sequence of stored code symbols including the most recent code symbol generated and the preceding five code symbols. The pattern of stored code symbols, at any instant, defines a state of signal activity relative to the received signal. The output of all six stages are provided to a first decoder 76, with the outputs of the second through fifth stages being provided to a decoder 78, and with the outputs of the third through sixth stages being provided to the inputs of a decoder 80. The decoded message from the decoder 76 is provided to the input of a filter table 82 which functions to provide a non-linear smoothing value for the received code symbols. The filter table is described in detail in copending U.S. Pat. application Ser. No. 458,936, filed Apr. 8, 1974, on behalf of P. A. Franaszek et al now U.S. Pat. No. 3,916,314, which patent is assigned to the assignee of the present invention. The output from the decoder 80 is provided to the input of a delta table 84 which is identical in operation to the delta table 26 illustrated in FIG. 1. The output from the decoder 78 is provided to the input of a gain logic network 86 which is similar to and functions in a like manner as the gain logic network 28 illustrated in FIG. 1. The selected smoothing value from the filter table 82 is provided to a plurality of gates 87 which are under the control of the gain logic network 86 to provide a modified smoothing value which is the selected smoothing value multiplied by a predetermined integer value as determined by the gain logic network 86.

The signal output from the detla table 84, that is the selected incremental signal level, is passed to the gates 88 which provide a modified incremental signal level output which is the selected incremental signal multiplied by an integer value determined by the gain logic network 86. The respective outputs from the gates 87 and 88 are provided at selected times via a line 90 to the inpt of a data register 91 which in turn provides an output signal to the first input of an adder network 92, which output signal is summed with successive accumulated modified signal increment levels. The output of the adder 92 is provided to the input of a gate 93, the input of a gate 94, and the input of a gate 95. The signal passed by the gate 93 is the accumulated modifed delta increment values which have been summed with successive modified smoothing values from the filter table 82. This signal is then passed to the input of a data register 96, and then to a D/A converter 97, with the analog signal appearing at the output thereof being provided to an analog receiver 98 as a usable reproduction of the analog input signal provided by the source 6 as shown in FIG. 1.

The output from the adder 92 is passed by the gate 95 to the accumulator 99 for accumulation of the modified delta increments, which are then passed by a gate 100 to the input of data register 101, which also has applied to the same input, via the gate 94, non-accumulated modified delta increments. The modified delta increment values appearing at the output of the shift register 101 are provided to a second input of the adder 92 and are summed with the new modified smoothing value.

Figure 4:
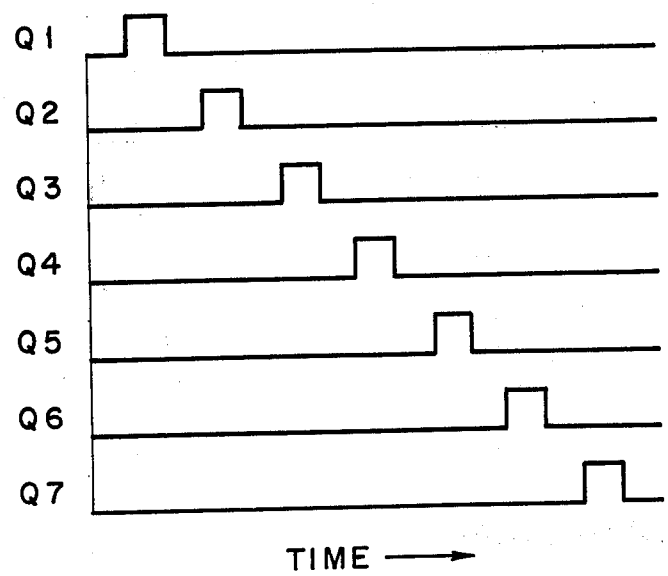
FIG. 4 is a timing diagram helpful in the understanding of the decoder illustrated in FIG. 3 and FIG. 14.

Refer now to FIG. 4 which is a timing diagram which sets forth the timing sequence of the decoder 70 illustrated in FIG. 3 and 14. At Q1 pulse time the code symbols stored in the storage register 72 are shifted to the temporary storage portion thereof. At pulse Q2 time the code symbols stored in the temporary stages of the register are then shifted to the following stages and the accumulated modified delta increments are shifted from the accumulator 99 through the gate 100 and the data register 101 to the adder 92 for addition with the modified smoothing value. At pulse Q3 time the decoder 78 is sampled by the gain logic network 86 for determining which modifier signal is to be generated in response to the present state of signal activity. At pulse Q4 time the selected delta increment, as manifested at the output of the delta table 84, is modified, that is multiplied, by the selected integer value from the gain logic network 86 and is passed via the line 90 to the input of the data register 91 and then to the adder 92 for addition with the old sum presently stored in register 101. At pulse Q5 time the new sum output from the adder 92 is passed by the gate 94 to the input of the data register 101, and is passed by the gate 95 to the input of he accumulator 99. At pulse Q6 the selected smoothing value from the filter value table 82 is modified, that is multiplied in the gates 87 by the selected integer value from the gain logic network 86 and is passed by the line 90 to the input of the data register 91 and to the adder 92 for addition with the new sum. At pulse Q7 time the output from the adder 92, which is the new sum plus the modified smoothing value, is passed by the gate 93 to the shift register 96 and from there to the D/A converter 97 for conversion to analog form for reception by the analog receiver 98 for reconstructing the input signal. This cycle repeats for the duration of system operation. It is seen that delta increments are accumulated and are summed with successive modified smoothing values for forming a digital signal which is subsequently converted to analog form for reception by the analog receiver 98.

Refer now to FIG. 5 and in particular to FIG. 5A which is a portion of the encoder 2 as illustrated in FIG. 1. The encoder is shown as a double rail system, that is, for each element in the system there is a first line for binary 1 signals and a second line for binary 0 signals. Accordingly, when there is a binary 1 signal there is a signal on the first line and no signal on the second line. Conversely, when there is a binary 0 signal, there is a signal on the second line and no signal on the first line. That is, when the first line is active the second line is inactive and vice versa. The comparator 4 receives at a first input the analog input signal from the source 6 on line 102, and receives the prediction signal at a second input via line 104 as explained relative to FIG. 1. When the analog input signal appearing on line 102 is greater than or equal to the analog prediction signal appearing on line 104, there is a signal manifested on the line 106, that is line 106 is active and line 108 is inactive, representing a binary 1 condition. Whenever the prediction signal appearing on line 104 is greater than the analog signal appearing on line 102, there is a signal manifested on the line 108, that is the line 108 is active and line 106 is inactive, representing a binary 0 condition. At pulse time P3 the gate 12 passes the signal which is manifested on the particular active line at this time, with the signal being applied to the storage register 18, and via the line 20 to the decoder 70.

The storage register 18 is comprised of flip-flop stages 142, 144, 146, and 148. There are intermediate storage stages comprising flip-flops 150, 152, and 154. At pulse P1 time as manifested on line 156, contents of flip-flop 142 are passed by a gate 142 to storage stage 150; the contents of flip-flop 144 are passed by a gate 145 to storage stage 152; and the contents of flip-flop 146 are passed by gate 147 to the storage stage 154.

At pulse P3 time, the gate 12 passes the generated code symbol from the comparator 4 to the first storage register stage 142. Also at P3 time the gate 151 is enabled to pass the information stored in the flip-flop 150 to the second storage register stage 144; the gate 153 is enabled to pass the information stored in the flip-flop 152 to the third storage register stage 146; and the gate 155 is enabled to pass the information stored in the flip-flop 154 to the fourth storage register stage 148. The decoder 22 decodes the instant sequence of code symbols stored in the storage register 18, for determining the instant state of signal activity, and provides on an output line 24 at any instant one of the 16 possible decoded binary signals illustrated on the line 157, with these binary decoded signals also being manifested on the line 112 which connects to the delta value table 26 and the threshold table 30. The 16 possible information lines forming the line 157 are connected in a predetermined manner as illustrated to OR gates 159, 161 and 163, with the outputs of these gates being connected to the gain logic network 28 which is illustrated in FIG. 5D. The gate 159 is enabled whenever there is a high state of signal activity which is manifested by either a condition of all 0's, or all 1's in the decoded sequence. The gate 161 is enabled whenever there is a intermediate state of signal activity, such as a condition of 0 0 0 1, or a condition of 1 1 1 0. The other binary states which enable the gate 161 are readily ascertained from FIG. 5A. The gate 163 is enabled whenever there is a low state of signal activity, such as 0 1 0 0 or 1 0 1 1, with other states of signal activity which enable the gate 163 being readily ascertainable from FIG. 5A.

Refer to FIG. 5B which illustrates the delta value table 26 and the gates 32. The binary coded signal appearing on line 112 energizes, at any given time, one of a possible 16 output lines 114 from the delta value table 26 with the output signal from table 26 being applied concurrently to gates 120, 122, 124, 126, 128, and 130, with only one of these gates being enabled at any instant of time. Appearing on line 36 is the multiplier signal from the gain logic network 28 as illustrated in FIG. 5D.

At any given time one of the lines 181, 183, 185, 187, 189 and 191 is active for enabling a selected one of the gates 121, 123, 125, 127, 129 and 131, respectively, for providing a signal output at pulse P5 time for modifying the selected delta increment. For a low state of signal activity, as represented by the decoded sequence from the decoder 22, the gain logic network 28 provides an enabling signal on the line 181 for permitting the gate 121 to provide a signal output at pulse P5 time for enabling the gate 120 to provide a modified delta increment to the line 38. Whenever the gate 120 is enabled, the selected delta increment from the delta increment table is multiplied by 1, that is the delta increment remains the same. Whenever an enabling signal is present on the line 183 the gate 123 is enabled for providing a signal output for enabling the gate 122 to effect multiplying the selected delta increment value by 2. Whenever the line 185 is active, the gate 125 is enabled for providing a signal output for enabling the gate 124 to effect multiplying the selected delta increment value by 4. Whenever the line 187 is active, the gate 127 is enabled for providing an output signal for enabling the gate 126 to effect multiplying the selected delta increment value by 8. Whenever the line 189 is active the gate 129 is enabled for providing an output signal for enabling the gate 128 to effect multiplying the selected delta value increment by 16. Whenever the line 191 is active, the gate 131 is enabled for providing an output signal for enabling the gate 130 to effect multiplying the selected delta value increment by 32. The functioning of the respective gates in the gates 32 is described in more detail relative to FIG. 6. Suffice it to say that the multiplications performed by the gates 32 is by shifting techniques, that is, when the message is to be multiplied by 2, it is shifted one place, and when it is to be multiplied by 4 it is shifted by two places, and so on.

The accumulation and addition process performed by the accumulator 54, adder 44 and associated gates and registers is the same as described relative to FIG. 1, and accordingly the description is not repeated here.

Refer to FIG. 5C which illustrates the threshold table 30, and the gates 34. The threshold table 30 responds to the decoded message on line 112 for activating one of 16 output lines 118 which provide a selected threshold value to the respective gates comprising the gates 34. The gates 34 are identical to the gates 32 with like elements having a prime affixed thereto, and therefore their operation is not explained in detail, except that the gates 34 perform the modification operation in response to the pulse P1 appearing on the line 184. A source of logical 1 is provided at a terminal 135, and a source of logical 0 is provided at a terminal 137 for providing energization potential for the gates 32 and 34. In practice, the terminals 135 and 137 are returned to a source of positive potential. In practice, however, it is a design choice whether to use positive potential, negative potential, a positive source of current or a negative source of current.

Refer to FIG. 5D, which illustrates in detail the gain logic network 28, which network selects the modifier signal in response to the state of signal activity represented by the decoded signal appearing on line 24 at the output of the decoder 22. The gain logic network 28 includes an 8-bit counter 162, which includes a low order section comprised of the first five stages of the counter, and a high order section which is comprised of the three high order stages of the counter. There is a decoder 166 which is responsive to the counts in the five low order stages of the counter, and a decoder 164 which is responsive to the three high order stages of the counter. The three high order stages of the counter are interconnected such that there can never be a count of higher than 5 manifested by the three high order bits. Therefore, the decoder 164 is designed to respond to the counts 0 through 5, which are manifested on the decoder output lines 109, 111, 113, 115, 117, and 119, respectively. The decoder 166 responds to a count of 0 on a line 103, a count of 1 on a line 105, and a count of greater than 24 on a line 107. The counter 162 is never allowed to be decremented below 0, and the count indicative of the state of the three high order bits are never allowed to exceed the value of 5. At P4 time, as manifested on line 192, one of gates 170, 174, or 180 are enabled to either increment or decrement the counter. In some instances, however, the counter is neither incremented or decremented, depending upon the state of signal activity and the instant count in the counter. The logic for assuring that the counter 162 is never decremented below zero is effected in part by the gate 171, which has inputs from the lines 103 and 109 which is a zero count line from the decoders 166 and 164, respectively. When both of these lines are active, there is a signal output from the gate 171 which is passed by an inverter 168 as a negative signal which disables an AND gate 170 which prevents the counter being decremented by 1. Also at this time the OR gate 176 passes the signal output from the gate 171 which is inverted by an inverter 172 for disabling and AND gate 180, which prevents the counter from being decremented by 2. Whenever there is a count of 1 in the decoder 166 and a count of 0 detected by the decoder 164, the lines 105 and 109 active enabling the gate 179 to provide a signal output which is passed by the OR gate 176 which is inverted by the inverter 172 for disabling the AND gate 180 which prevents the counter from being decremented by 2, which therefore keeps the counter from being decremented below 0. Since the counter may never be allowed to have a count greater than 5 from its three high order stages, the gate 175 is enabled whenever a count of greater than 24 is detected by the decoder 126 such that a signal is provided on a line 107, and a count of 5 is detected by the decoder 164 such that a signal is present on the line 119 enabling the gate 175 to provide a signal output which is inverted by the inverter 178 for disabling the gate 174 such that the counter may not be incremented by 8.

It is seen that the counter 162 is incremented by 8 whenever there is a signal output from the gate 159, as illustrated in FIG. 5A, which is indicative of a state of high signal activity. The gate 180 is enabled for decrementing the counter by 2 whenever there is a state of intermediate signal activity as manifested by a signal output from the OR gate 161 (FIG. 5A). The counter is decremented by 1 whenever the gate 170 is enabled, which occurs whenever the OR gate 163 (FIG. 5A) provides a signal output which is indicative of a state of low signal activity. It is to be appreciated that other gating arrangements and counting arrangements may be used in the practice of the present invention for selecting the modifier signal. The modifier signals which are manifested on the respective output lines from decoder 164, are in ascending order for increasing states of signal activity, that is the higher the state of signal activity, the higher is the multiplication factor which is applied to the gates 32 and 34 via line 36.

Figure 6A:
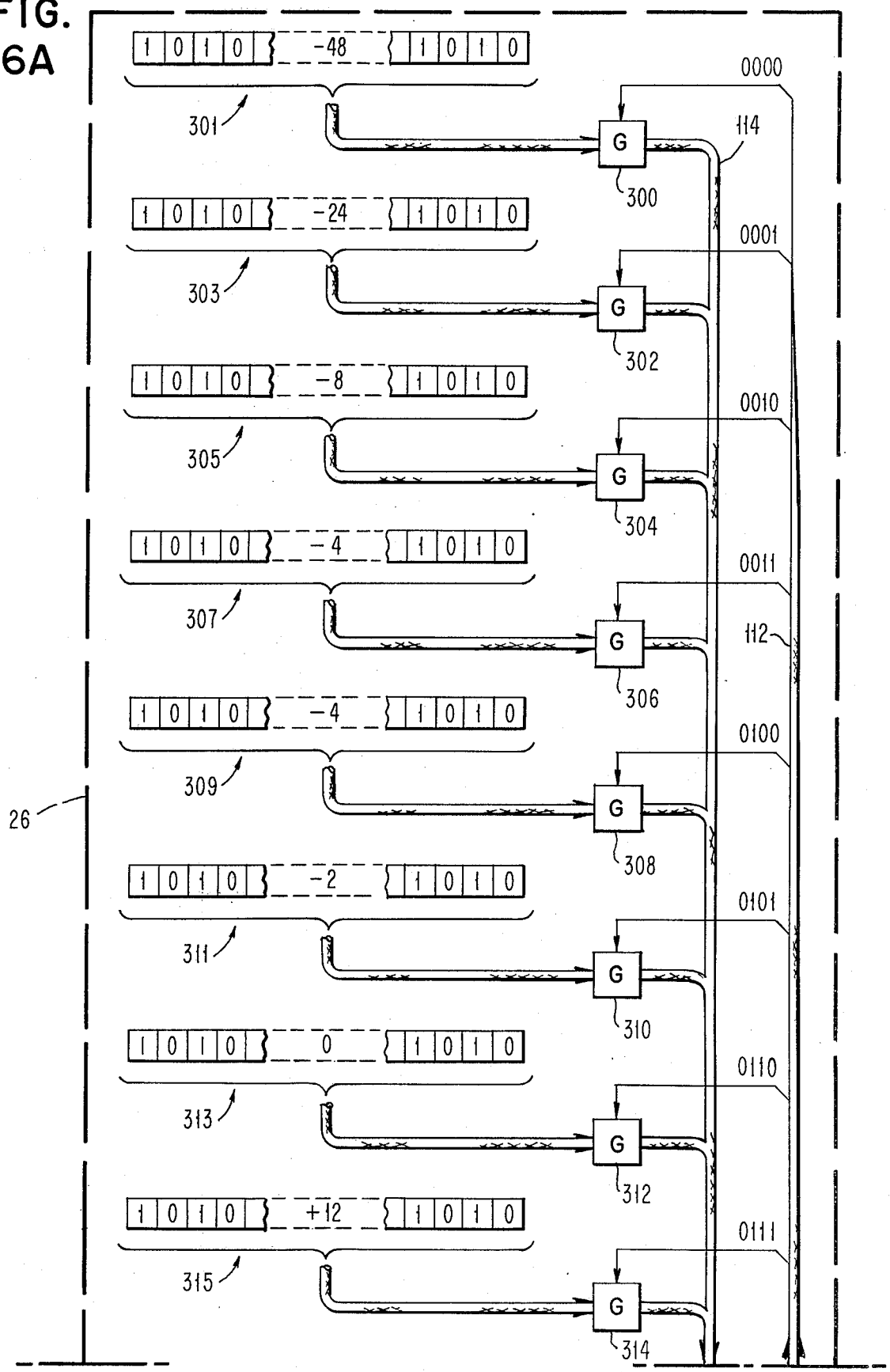
Figure 6B:
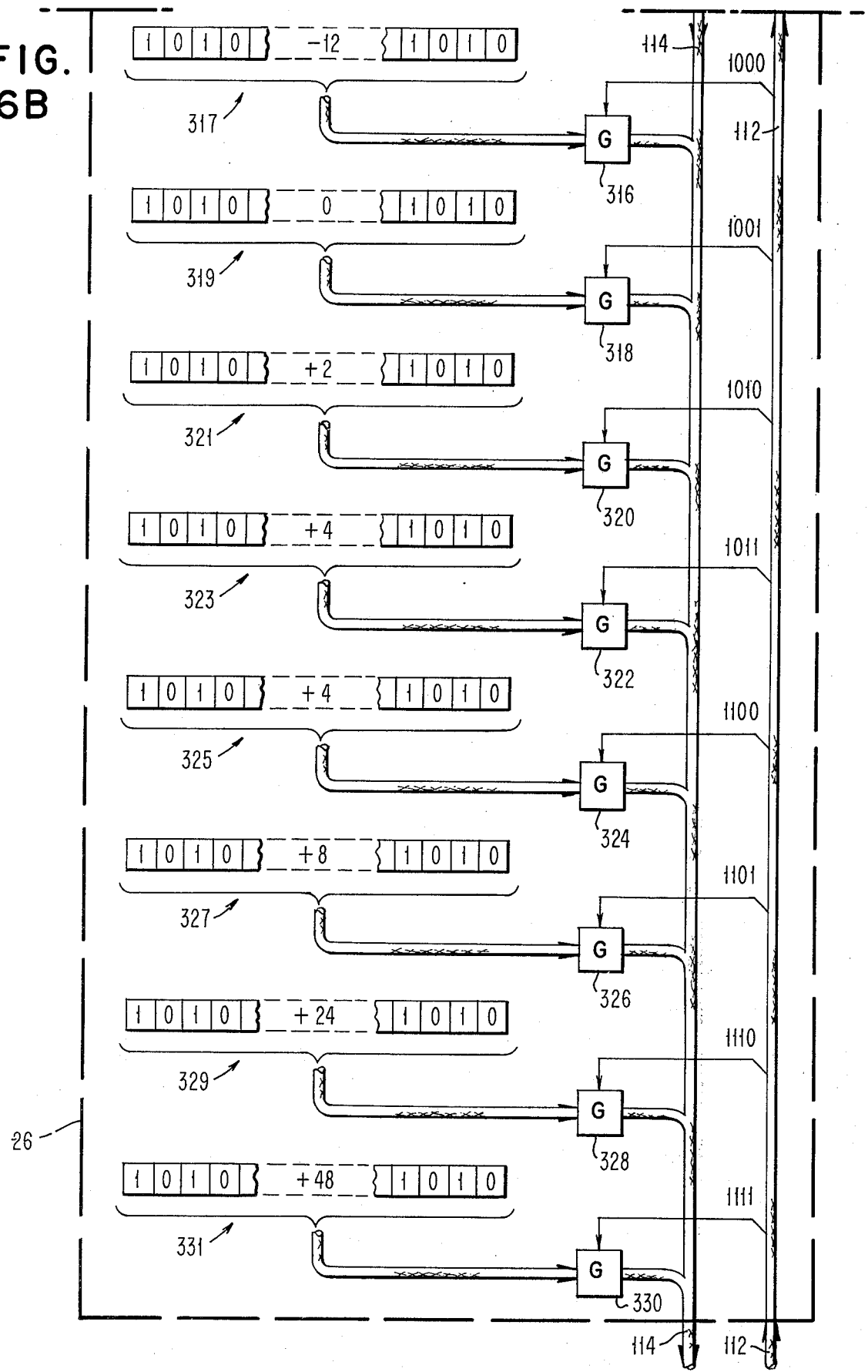

Refer now to FIG. 6 and in particular FIG. 6A which shows a portion of the delta value table 26. the decoded signal appearing on the line 112 is applied at any instant to a selected one of the gates 300, 302, 302, 306, 308, 310, 312 and 314, and the gates on FIG. 6B, with one of these gates being enabled. Whenever the decoded signal is 0 0 0 0, which is indicative of a state of high signal activity, the gate 300 is enabled and a register 301 provides a binary output which is indicative of the integer value −48, which is the selected delta increment and which is passed by the gate 300 to the output line 114 which is connected to the gates 32. The registers 301, 303, 305, 307, 309, 311, 313, 315 are all storage registers or alternatively read-only memory devices which provide a binary signal output having a fixed integer value which is gated out by its associated gate dependent upon the binary coded signal appearing on the line 112. The integer is in 2's complement form, with the most significant bit being the sign bit. When the most significant bit is a 1, the integer is negative, and when the most significant bit is 0 the integer is positive.

FIG. 6B is the remaining portion of the delta value table which functions in a like manner to the portion illustrated on FIG. 6A. Whenever the binary message 1 0 0 0 is present, the gate 316 is enabled for passing the integer value −12, which is stored in the storage register 317, which selected delta increment is then passed to the output line 114 which is connected to the gates 32. The other gates and registers shown in FIG. 6B function in a like manner in response to the binary signal appearing on the line 112.

Refer to FIG. 7 which illustrates in detail the threshold table 30 illustrated in FIG. 5C. FIG. 7A illustrates a portion of the threshold table, with the gates 332–339 being responsive to the storage registers 340–347, respectively, for passing the integer values stored in the respective registers in response to the respective gates being enabled by the decoded signal appearing on the line 112. For example, when the decoded signal appearing on the line 112 is 0 0 0 0, the gate 332 is enabled for passing the binary integer value −34 stored in the register 340 to the output line 112 for application to the gate 34. Also, when the binary decoded message appearing on line 112 is 0 1 1 1, the gate 339 is enabled for passing the binary stored integer −1 stored in the register 347 to the output line 118. Again, the integer values are expressed in 2's complement arithmetic.

FIG. 7B illustrates the remaining portion of the threshold table 30 and includes gates 348–355 which when enabled pass the binary integer value stored in the storage registers 356–363, respectively. For example, when the decoded binary message appearing on the line 112 is 1 0 0 0, the gate 348 is enabled for passing the binary integer value representing +1 which is stored in the register 356 which is then passed to the output line 118 for enabling the gates 34. When the binary message appearing on the line 112 is 1 1 1 1, the gate 355 is enabled for passing the binary integer value representing the integer +34 as stored in the register 363 which is then passed to the output line 118.

Figure 8A:
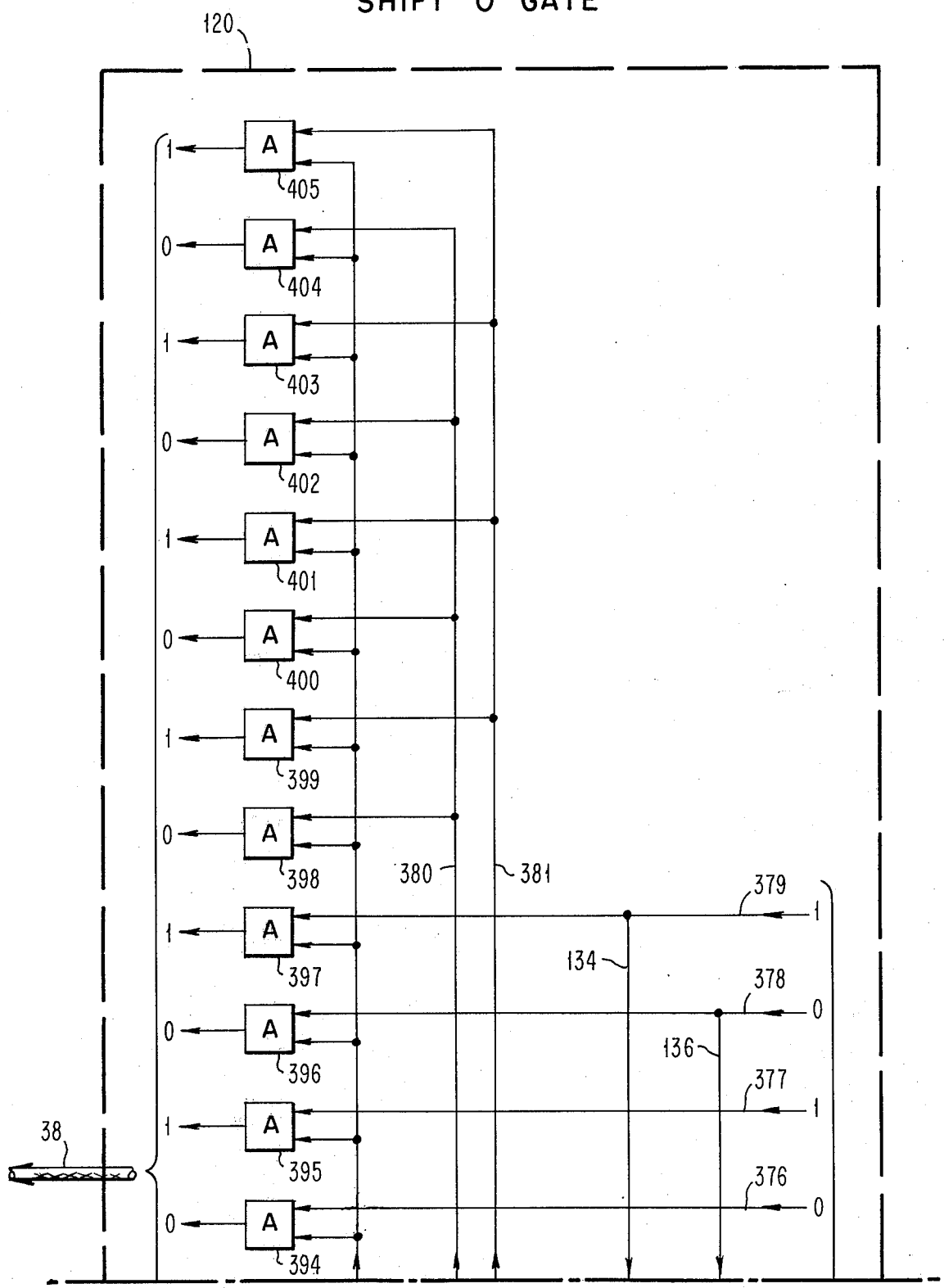
FIGS. 8A and 8B taken together as shown in FIG. 8 is a block diagram representation of gating network 120 illustrated in FIGS. 5C and 5D.
Figure 8B:
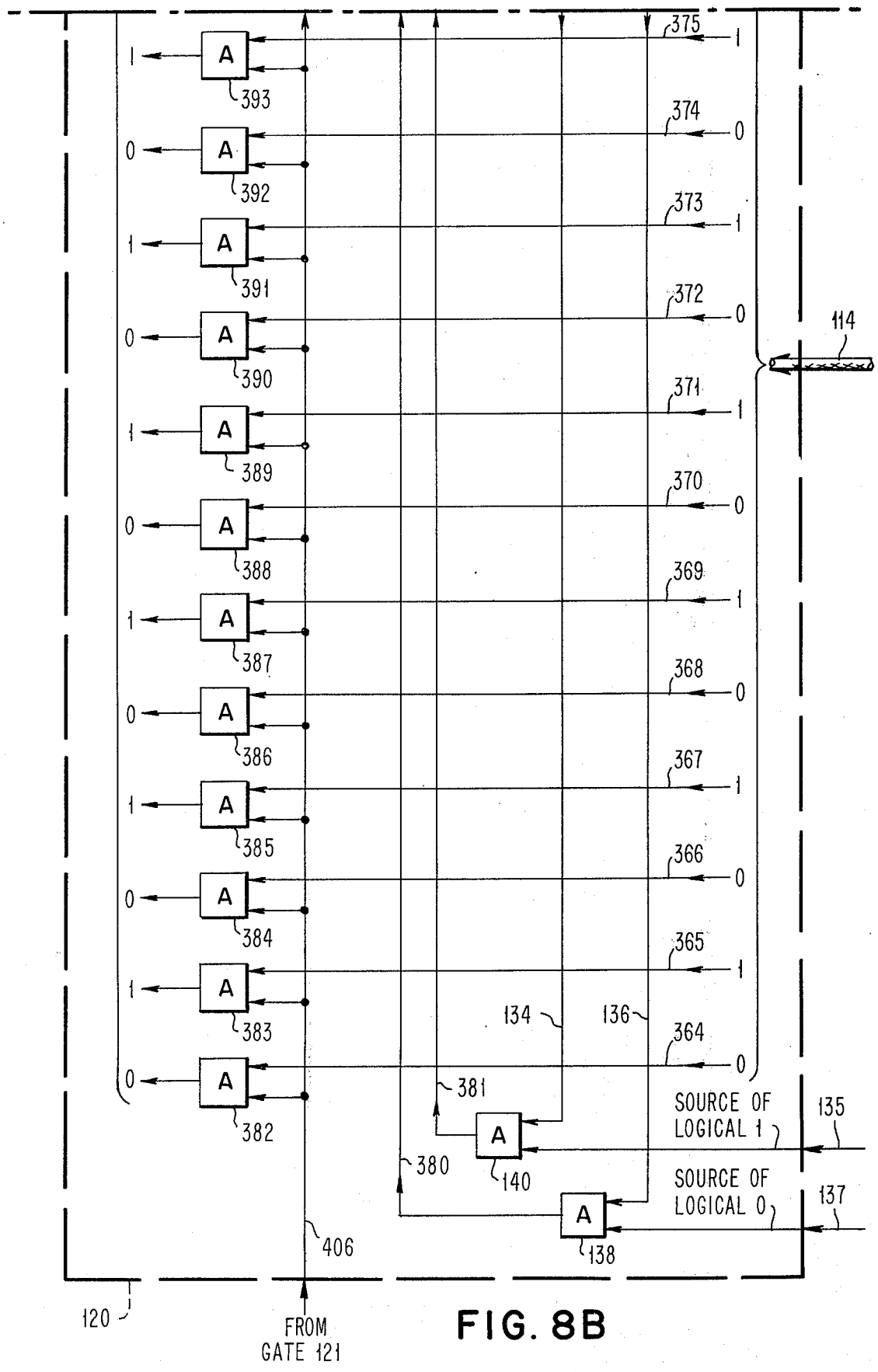

Refer now to FIG. 8 which is a block diagram representation of the gate 120 which effects a multiplication of the selected delta increment by 1. The 8-bit word comprising the selected delta increment provided on line 114 from the delta value table 26 is applied to the gate 120. The first bit position is comprised of the 0 line 364 and the 1 line 365 which are connected to AND gates 382 and 383, respectively, with the gate 382 providing a signal output when the line 364 is active concurrent with line 406 being active, which is indicative of a binary 0 for the first bit, and the gate 383 providing a signal output when the line 365 is active concurrent with line 406 being active, which is indicative of a binary 1 for the first bit. The eighth and most significant bit has the 0 line 378 connected to an AND gate 396 and the 1 line 379 connected to an AND gate 397. The eighth bit is the sign bit, that is when the 0 line 378 is active the delta increment is a positive number, and conversely when the line 379 is active the delta increment is a negative number. This is so since all arithmetic is performed in 2's complement, such that all additions and subtractions may be performed by the addition process. The intermediate bits are manifested on the lines 366–377, which enable the gates 384–395, respectively. Gates 398–405 are high order bits which assume the value of the sign bit. Whenever the selected delta increment is a negative number as manifested by the line 379 being active, a gate 140 is enabled for providing a source of logical 1 via a line 381 to the gates 399, 401, 403, and 405 to load 1's in the high order 4-bit positions. Conversely, when the delta increment is a positive number as manifested by the line 378 being active, a gate 138 is enabled to provide the source of logical 0 via line 380 to gates 398, 400, 402 and 404, respectively, for loading 0's in the four high order bit positions. It is seen, therefore, that the most significant bit position of the output of the gate 120, that is, the 0 output from the gate 404 or the 1 output from the gate 405 is the sign bit which is indicative of whether or not the modified selected delta increment is a positive or negative number. In response to a signal output from the gate 121 as manifested by the line 406 being active enabling the gates 382–405, the modified selected delta increment is provided on the output line 38 which is connected to the register 60 (FIG. 5C).

Figure 9A:
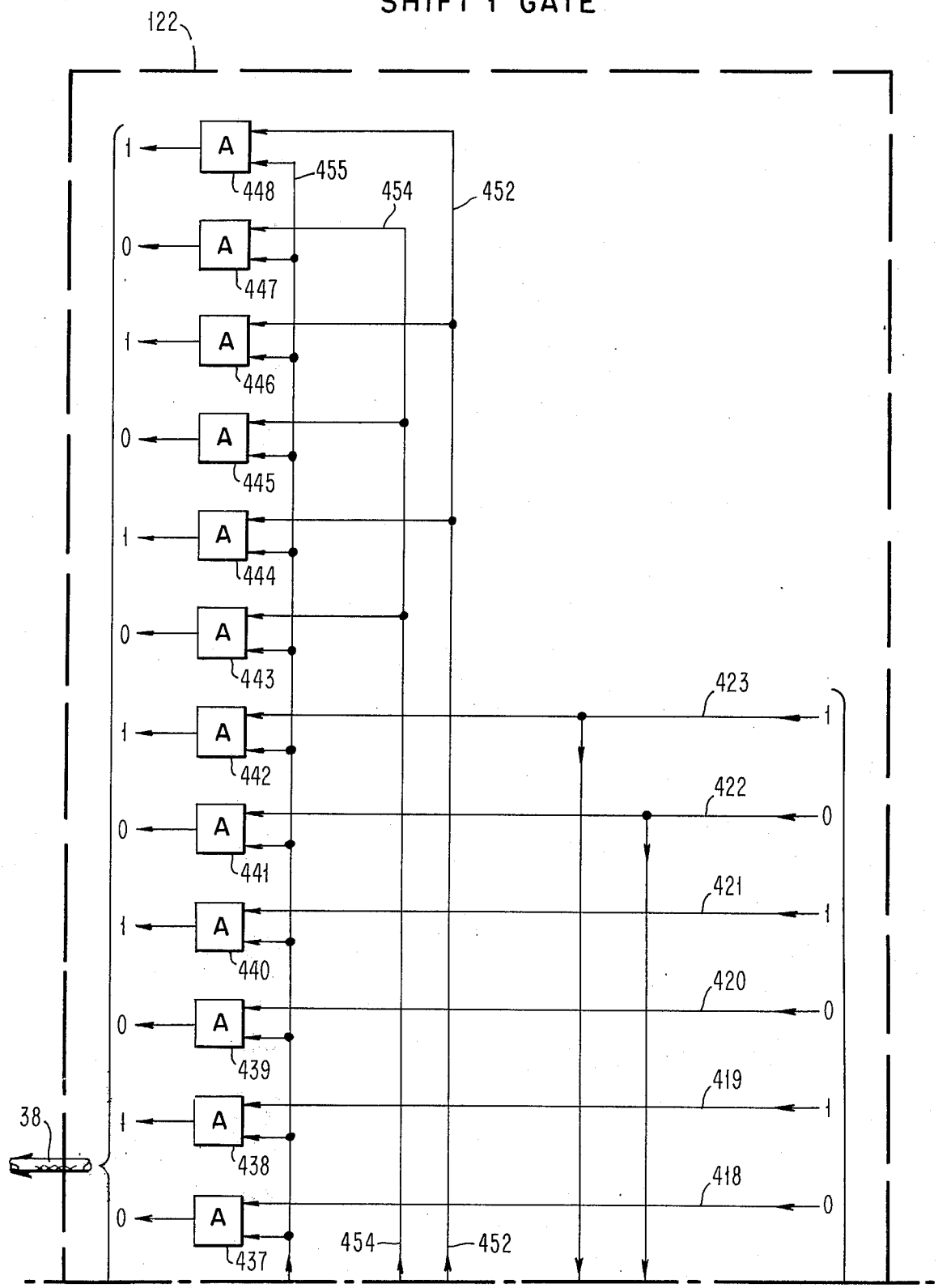
FIGS. 9A and 9B taken together as shown in FIG. 9 is a block diagram representation of gating network 122 illustrated in FIGS. 5C and 5D.
Figure 9B:
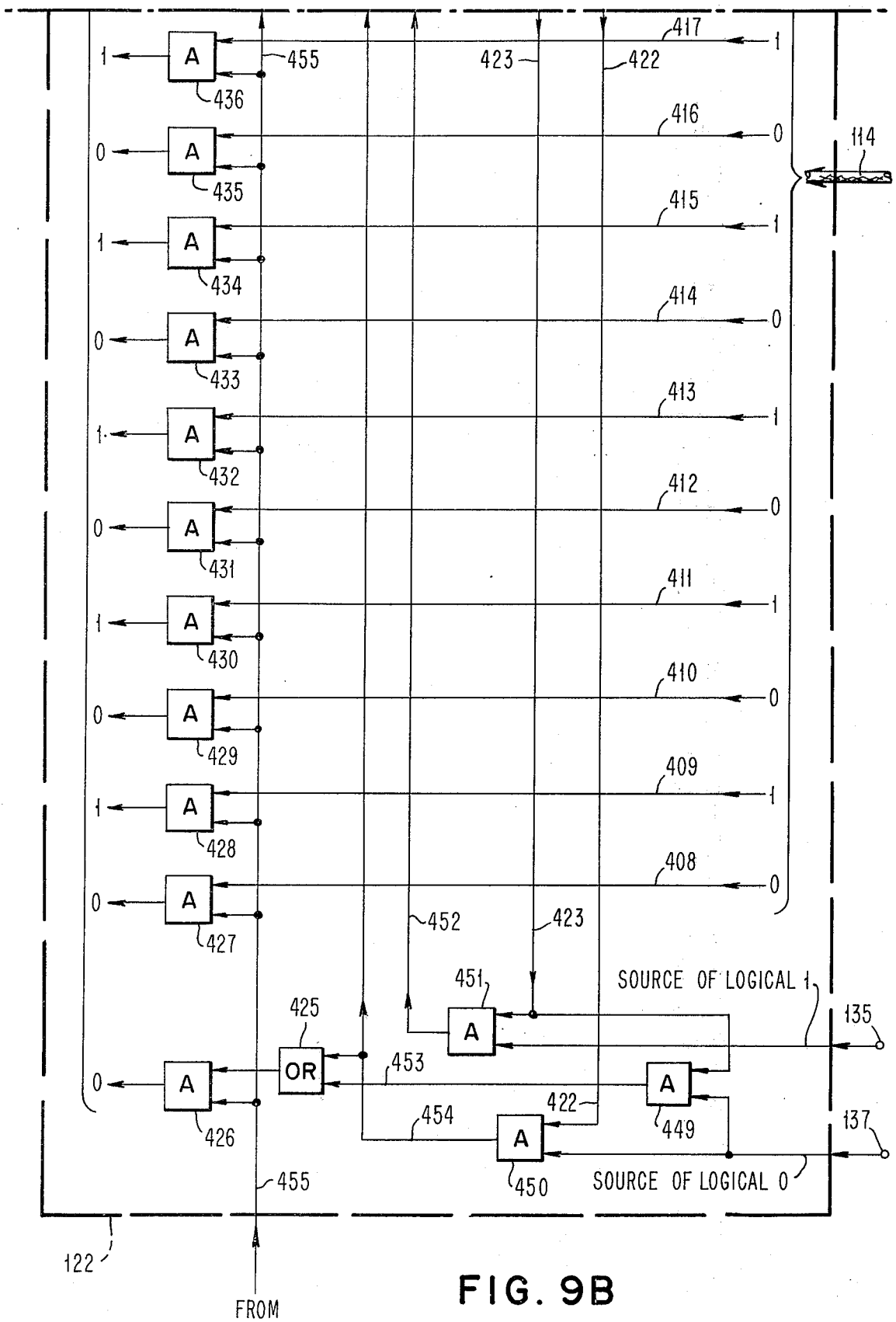

Refer now to FIG. 9 which illustrates in detail the gate 122 as illustrated in FIG. 5B. It is to be remembered that the gate 122 effects a multiplication by 2 of the selected detla increment which appears on the output line 144 from the delta value table 26. The first through eighth bits of the selected delta increment are provided on the lines 408–423, with the 0 line of the first bit appearing on line 408 and the 1 line of the first bit appearing on line 409. The most significant bit, that is the sign bit, has the 0 indication appearing on the line 422 and the 1 indication appearing on the line 423, with the line 422 being active when the selected delta increment is a positive number and the line 423 being active when the selected delta increment is a negative number. The multiplication by 2 is effected by shifting the eight bits by one place. This is effected by having the lines 408 and 409 connected to the gates 427 and 428, respectively, which are the second bit position of the output line. The first bit position of the output line is from the output of a gate 426, which has a 0 forced therein, by the following sequence. If the delta increment is a negative number as manifested by the line 423 being active, the gate 449 passes the source of logical 0 via a line 453 to an OR gate 425 for enabling the gate 426 to pass the logical 0 whenever the line 455 is active. If the delta increment is a positive number as manifested by the line 422 being active, the gate 450 passes the source of logical 0 to the second input of the OR gate 425 for again enabling the gate 426. When the delta increment is a positive number, the three high order stages are forced to a zero condition as manifested by the gates 443, 445 and 447 being enabled by way of the line 454 in response to gate 450 being enabled for passing the source of logical 0. Conversely, if the delta increment is a negative number the gates 444, 446 and 448 are enabled via the line 452 in response to the gate 451 being enabled for passing the source of logical 1. It is seen, therefore, that a 0 is forced into the low-order bit position as manifested at the output of the gate 426 and either a 0 or a 1 is forced into the three high-order bit positions depending on the sign bit.

Figure 10A:
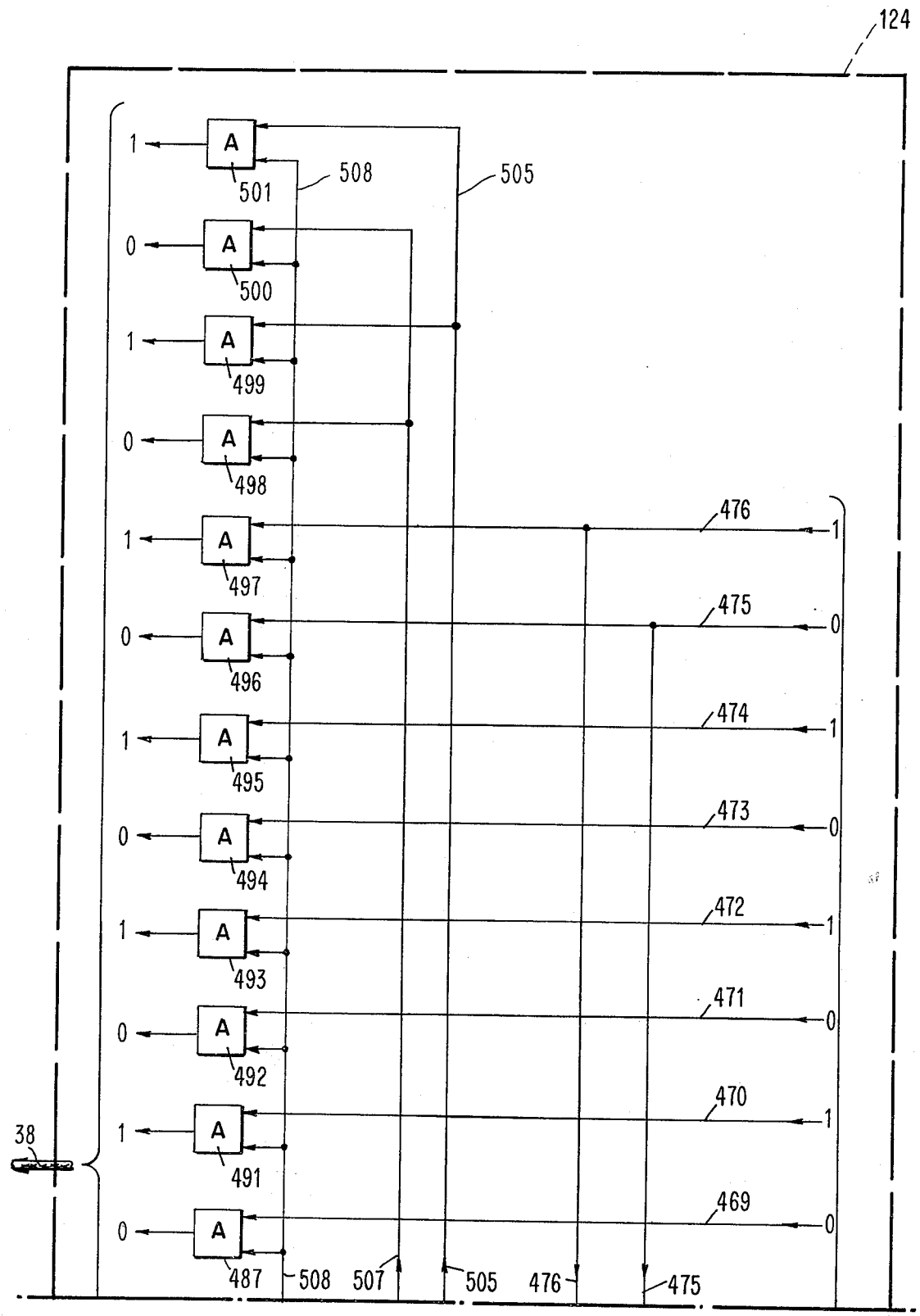
FIGS. 10A and 10B taken together as shown in FIG. 10 is a block diagram representation of gating network 124 illustrated in FIGS. 5C and 5D.
Figure 10B:
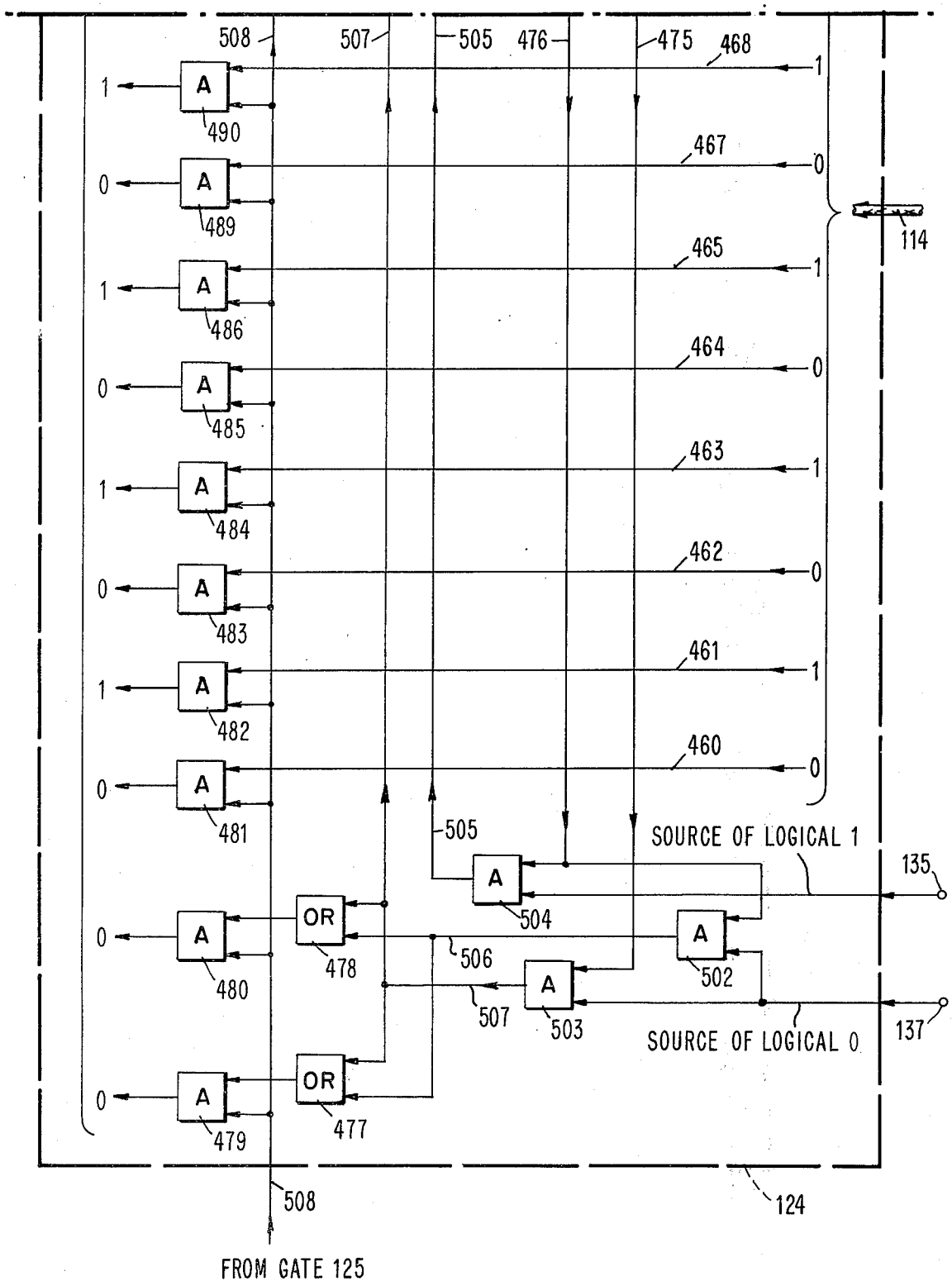

Refer now to FIG. 10 which illustrates in detail the gate 124, which effects multiplication of the selected delta increment by 4. The multiplication by 4 is effected by shifting the eight bits by 2 places. The eight bits from the delta value table 26 are manifested on the lines 460–476, with the 0 line and the 1 line of the first bit being manifested on the lines 460 and 461, respectively, and which are applied to the third bit position of the output line, namely the gates 481 and 482, respectively. The most significant bit is manifested on the lines 475 and 476 which are connected to the gates 496 and 497, respectively. Since the gate 124 effects multiplication by 4, the delta increment has to be shifted by three places, and accordingly the first two bits of the output from gate 124 must have 0's forced therein. Whenever the delta increment is a positive number, as indicated by the line 475 being active, the gate 503 is enabled making the line 507 active which enables gates 477 and 478 to pass the source of logical zero to enable the gates 479 and 480. If the delta increment is a negative number as manifested by the line 476 being active, the gates 504 and 502 are enabled passing the source of logical 1 and 0, respectively. The passed source of logical 0 enables the gates 477 and 478 enabling the gates 479 and 480, for again forcing 0's in the two low ordered bit positions. The line 505 is activated for forcing 1's into the two high order bit positions, and the line 507 is activated for forcing 0's into the two high order bit positions, and accordingly, the shift by two, that is, the multiplication by 4, is effected.

Figure 11A:
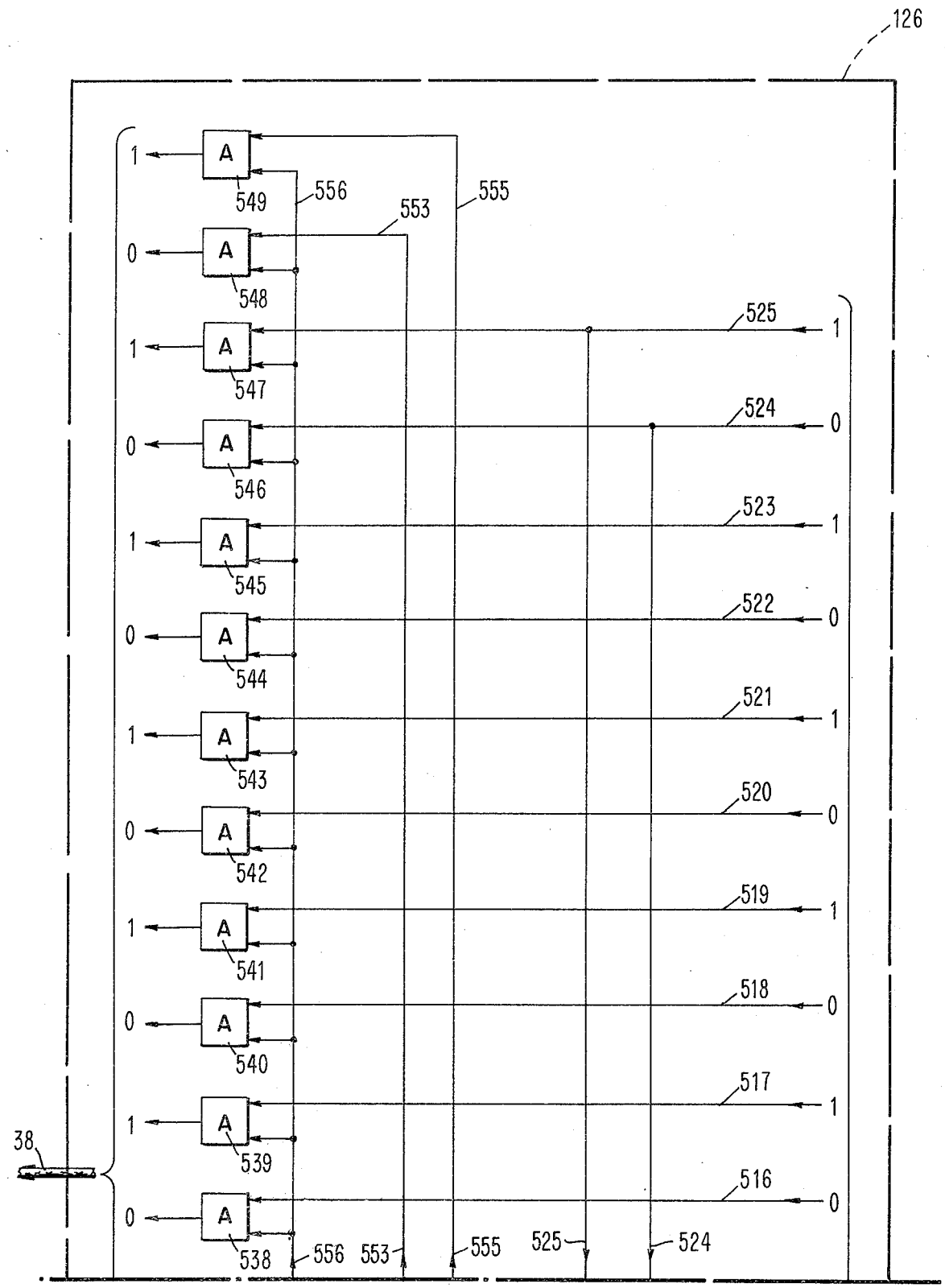
FIGS. 11A and 11B taken together as shown in FIG. 11 is a block diagram representation of gating network 126 illusrated in FIGS. 5C and 5D.
Figure 11B:
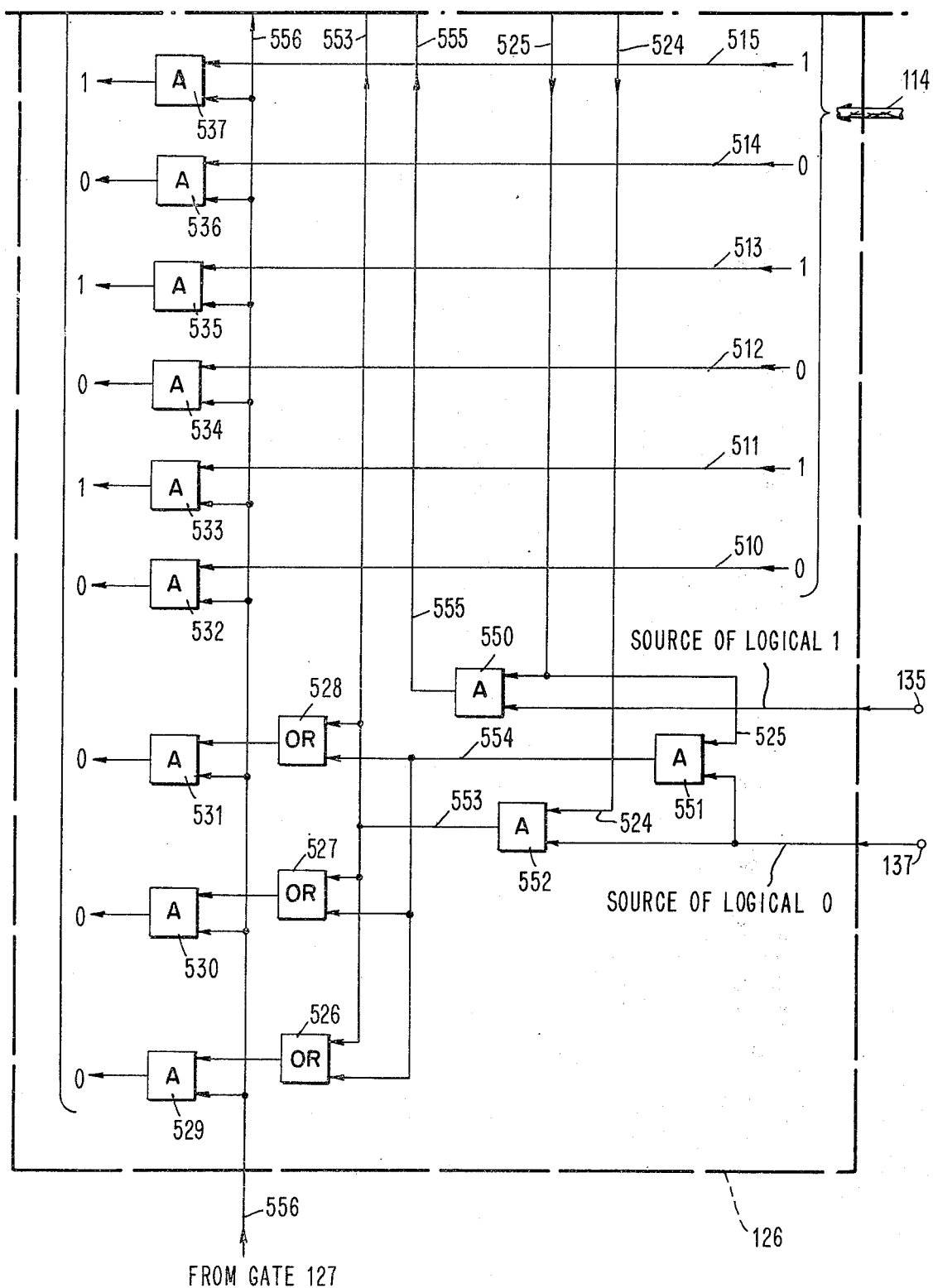

Refer now to FIG. 11, which is a detailed illustration of the gate 126, which when enabled shifts the selected delta value increment by 3 places and effects a multiplication by 8. This is accomplished by connecting the 0 and 1 line 510 and 511, respectively, of the first bit position of the selected delta increment to the fourth bit position of the output line, that is, the gates 532 and 533, respectively. The eighth bit position of the input delta increment as manifested on the lines 524 and 525 are connected to the eleventh bit position of the output line, that is, the gates 546 and 547, respectively. Zeros are forced into the three low order bit positions as follows. If the delta increment is a negative integer, the line 525 is active, which enables the gates 550 and 551 such that the source of logical 1 signal is applied via the line 555 to the most significant bit position, that is, the gate 549 for loading a 1 into the most significant bit position, and a source of logical 0 is passed by the gate 551 making the line 554 active, for causing the OR gates, 526, 527, and 528 to pass signals to the gate 529, 530 and 531, respectively, for providing a zero output indication from the three low order bit positions whenever the line 556 is active. If the selected delta increment is a positive integer, the line 524 is active enabling gate 552 to pass the source of logical 0 activating line 553 for enabling gates 526, 527, and 528 to pass signals to the gates 529, 530 and 531, respectively, for providing a zero output indication from the three low order bit positions whenever the line 556 is active. Since line 553 is active, a zero is forced into most significant bit position, gate 548. The lines 512–523 are the remaining delta increment input bits, and the gates 534–547 are the remaining output bit positions of the modified selected delta increments.

Figure 12A:
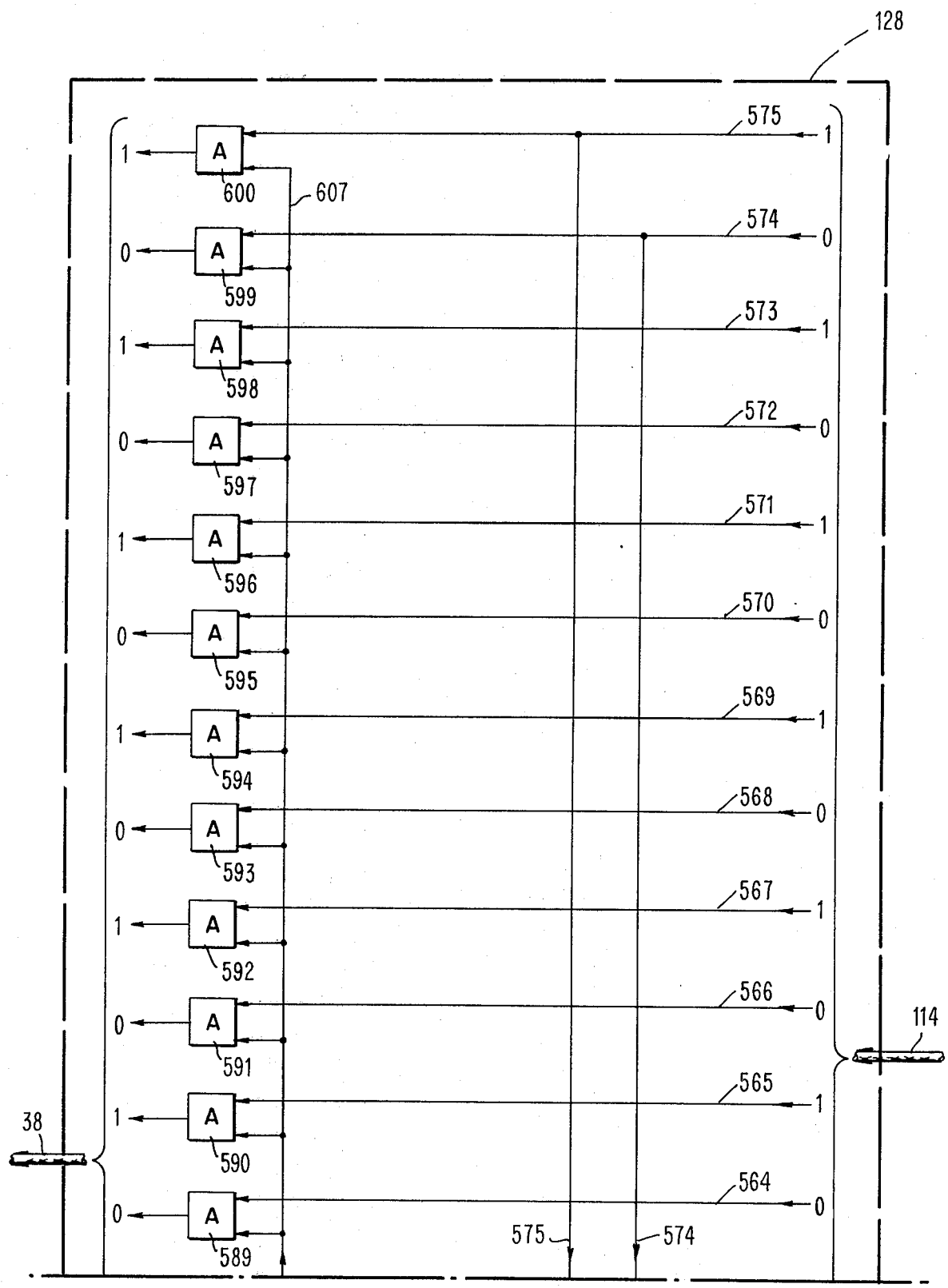
FIGS. 12A and 12B taken together as shown in FIG. 12 is a block diagram representation of gating network 128 illustrated in FIGS. 5C and 5D.
Figure 12B:
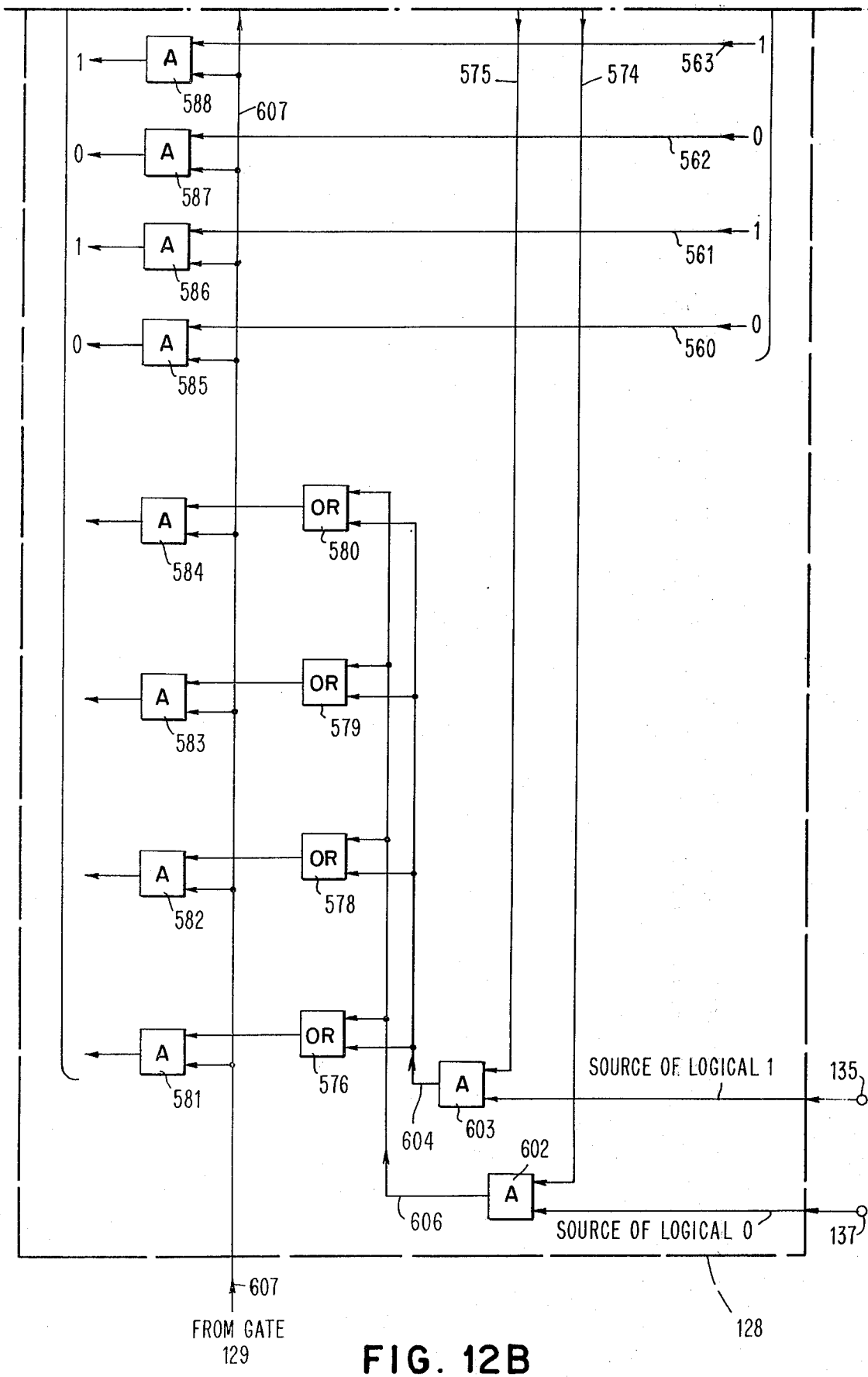

Refer now to FIG. 12 which illustrates in detail the gate 128 which effects a multiplication of 16 of the selected delta increment. This is effected by shifting the selected delta increment four places. The first bit of the input delta increment as manifested on the lines 560 and 561 are applied to the fifth bit position of the output modified delta increment word as manifested at the gates 585 and 586, respectively. Zeros are forced into the first four bit positions by the following process. If the input delta increment is a negative number, the line 575 is active, enabling the gate 603 to pass the source of logical 1 signal via line 604 to the inputs of the OR gates, 576, 578, 579, and 580, respectively, which in turn provide signal inputs to the AND gates 581, 582, 583, and 584, which provide zero output indications when the line 607 becomes active in response to the gain logic network requesting a modification or a multiplication factor of 16. Whenever the input delta increment is a positive integer as manifested by the line 574 being active, the gate 602 is enabled which passes the source of logical 0 to the gates 576, 578, 579, and 580, and in turn the AND gates 581, 582, 583, and 584 provide zero bit indications at their outputs in response to the line 607 becoming active. The gates 587–600 are the remaining bit position outputs for the modified selected delta increment, with the gates 599 and 600 being the sign bit, with gate 599 being the sign bit for a positive integer, and the gate 600 being a sign bit for the negative integer.

Figure 13A:
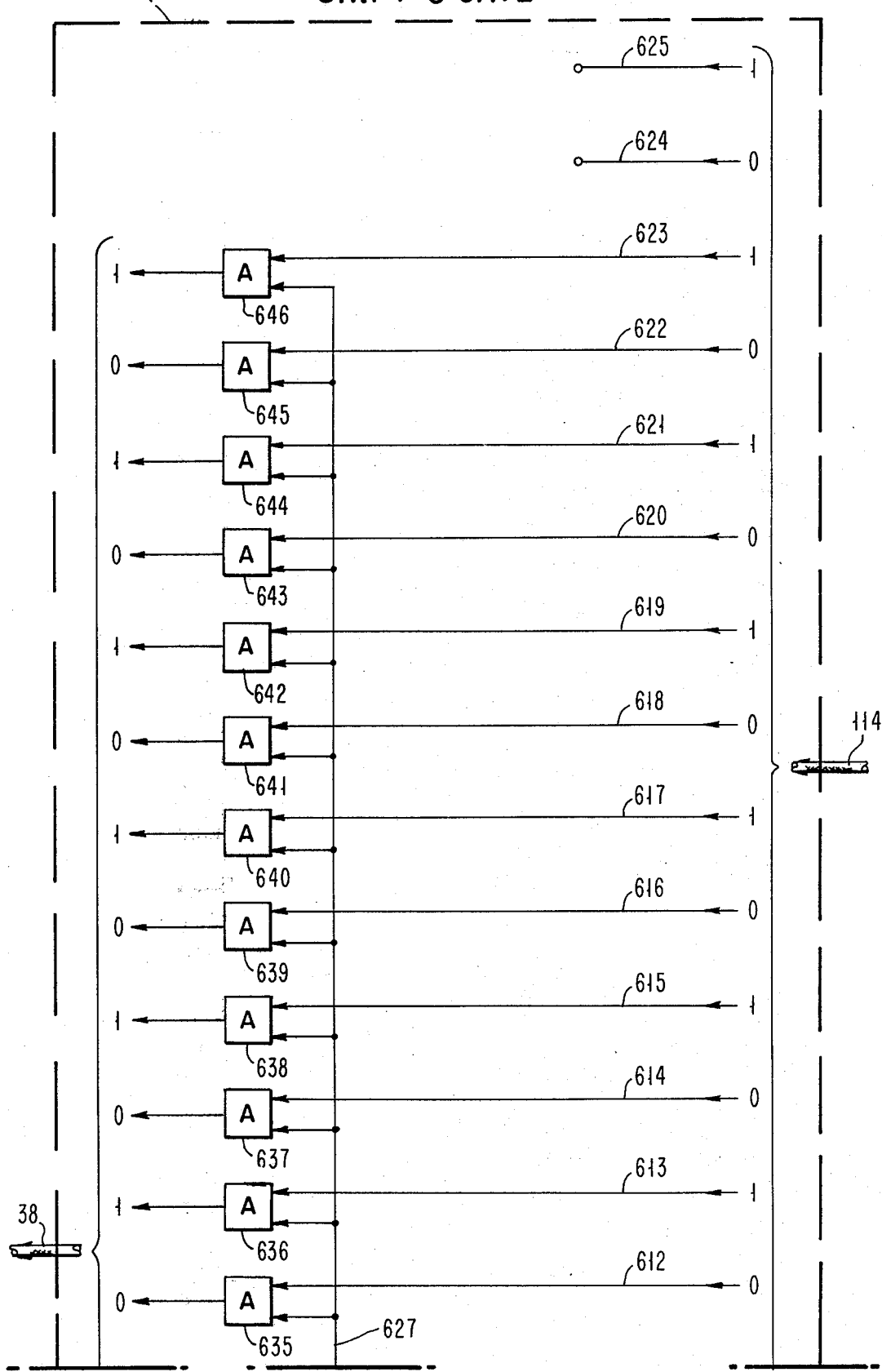
FIGS. 13A and 13B taken together as shown in FIG. 13 is a diagram of gating network 130 illustrated in FIGS. 5C and 5D.
Figure 13B:
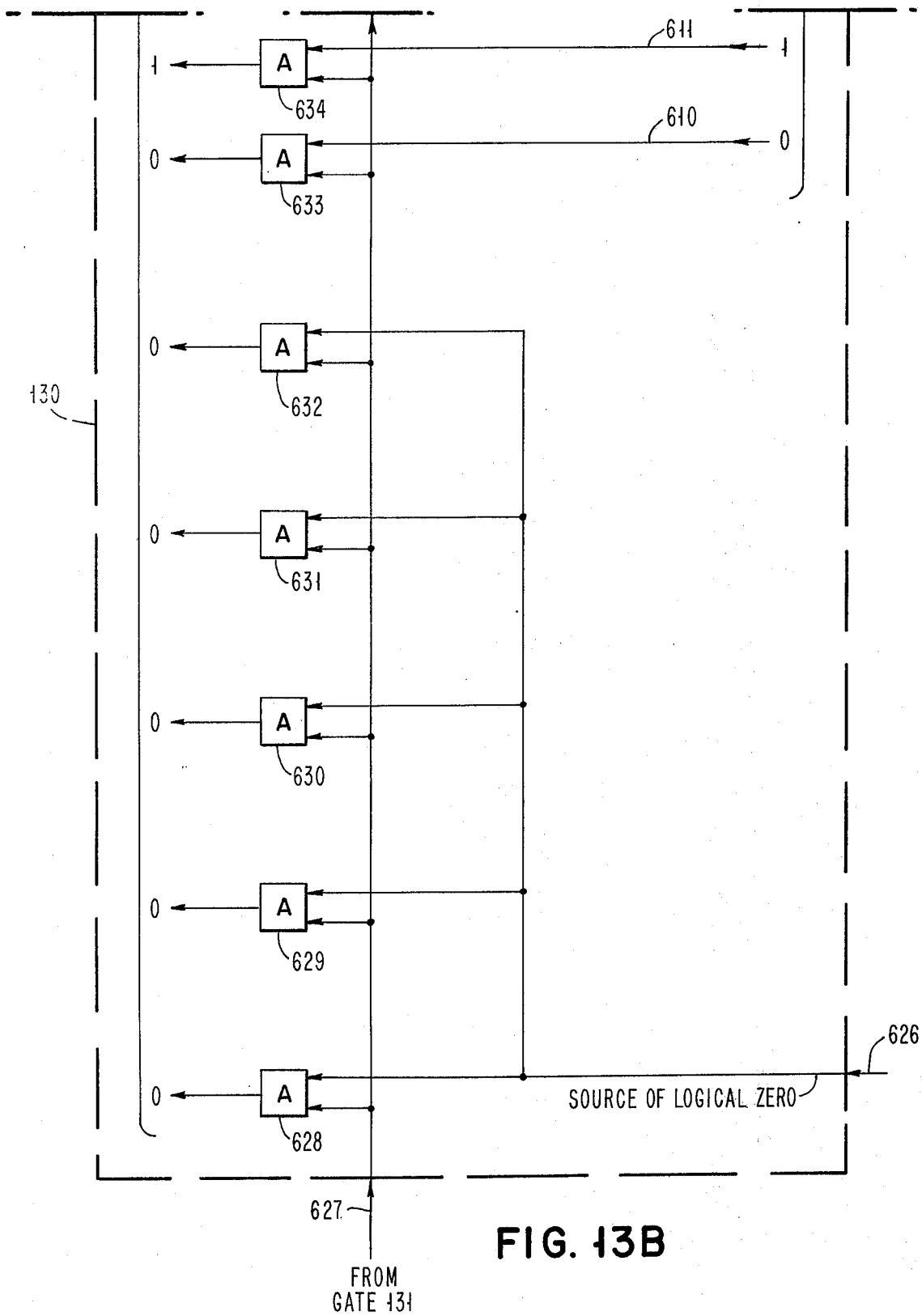

Refer now to FIG. 13 which is a detailed illustration of the gate 130 which effects a multiplication of 32 of the selected delta increment, that is, the selected delta increment is shifted five places. The lower five order bit positions are forced to a logical 0 condition in response to the line 627 becoming active, since the source of logical 0 on line 626 is applied directly to the five low order bit positions of gates 628–632. The first bit position of the input selected delta increment is manifested on lines 610 and 611 which are connected to the sixth bit position of the output line, namely gates 633 and 634. The most significant bit, that is, the sign bit, whcih is manifested on the lines 624 and 625 is unconnected, since these sign bits in effect are overflow in the 2's complement arithmetic for the multiplication by 32. The remaining bit positions of the input delta increment as manifested on the lines 612–623 are applied to the gates 635–646, inclusive.

Figure 14B:
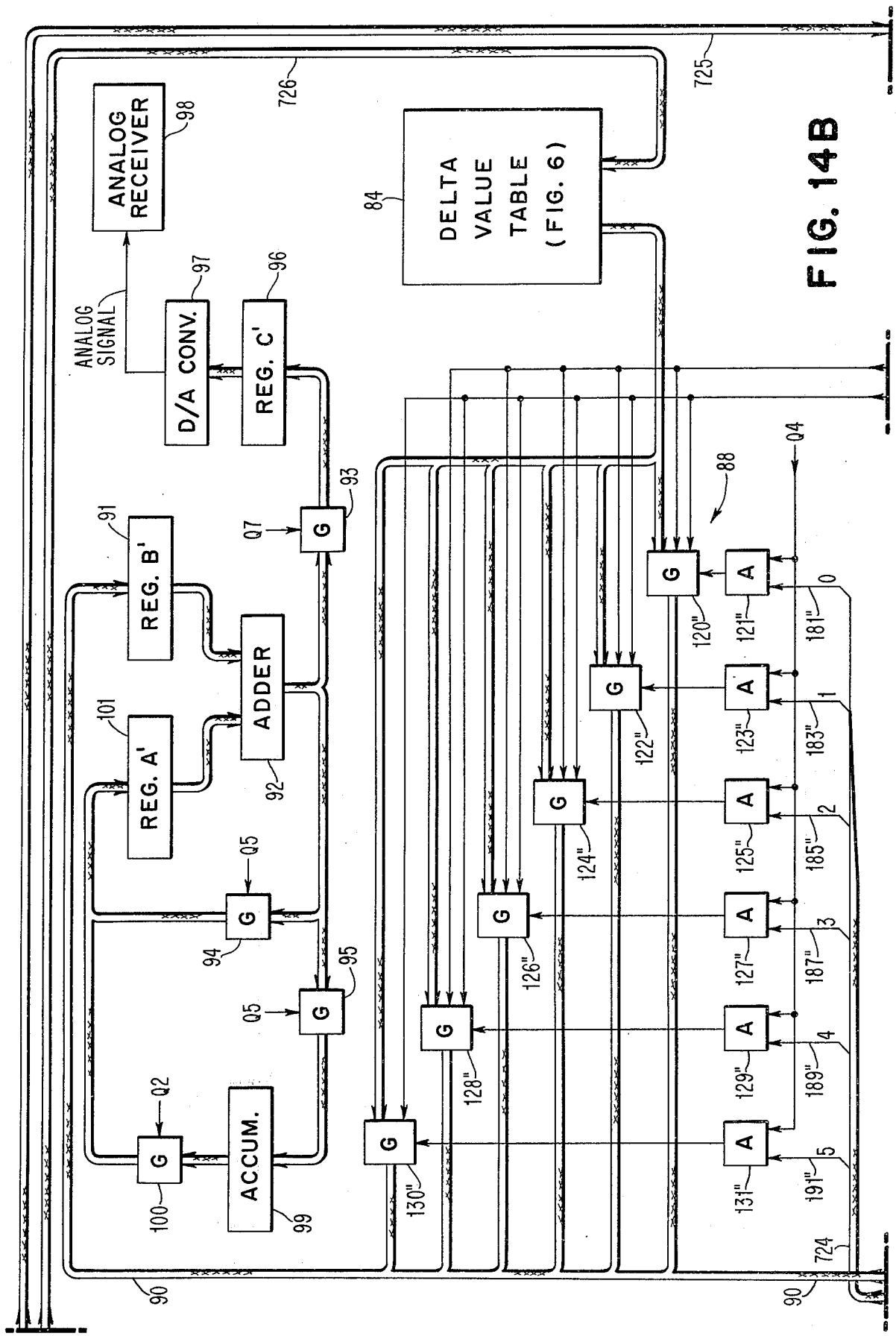
Figure 14C:
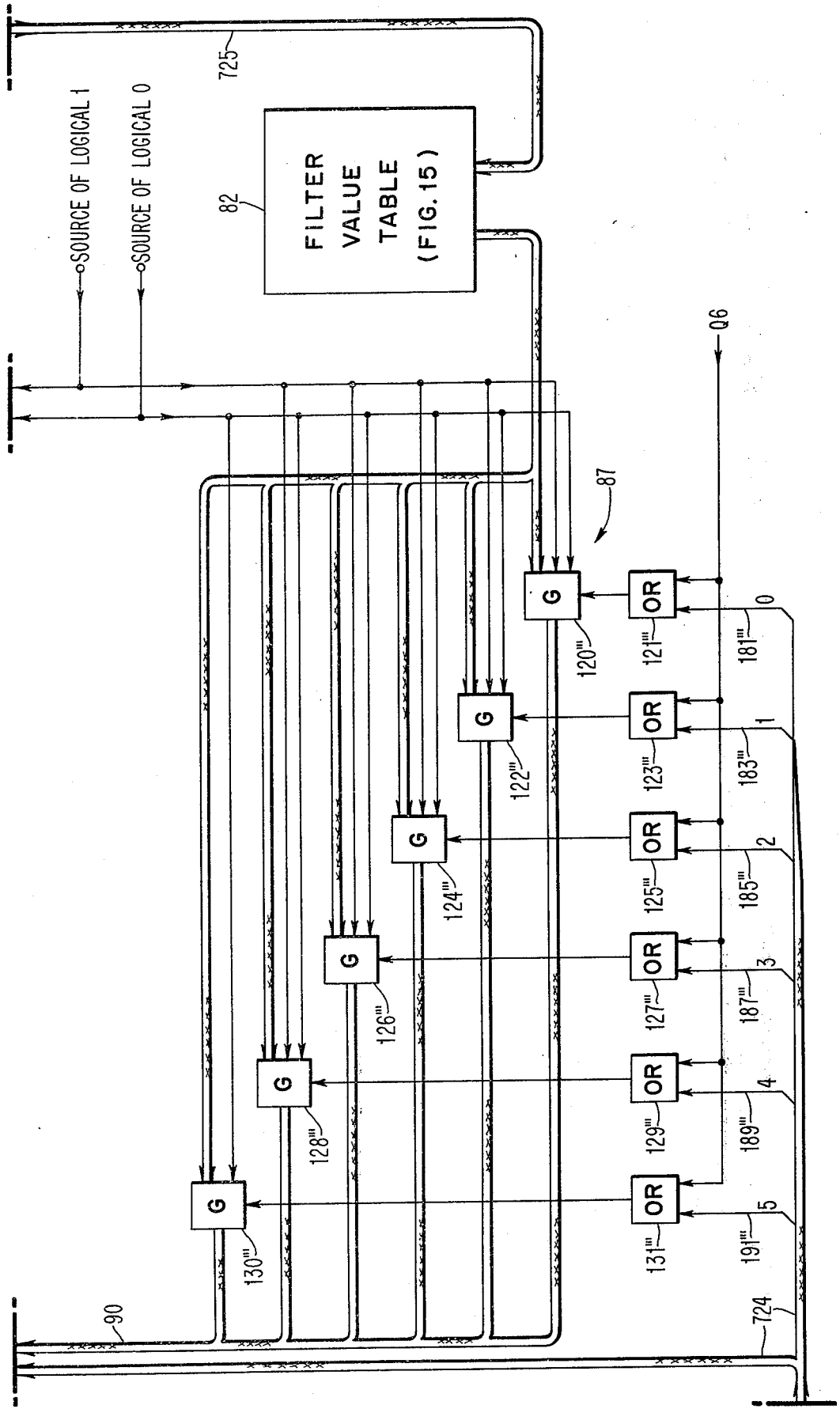

Refer now to FIG. 14 which is a detailed block diagram representation of the decoder 70. The code symbol sequence appearing on the line 20, manifests binary 1 indications when a line 721 is active, and manifests binary 0 indications when a line 722 is active. The line 721 and 722 are connected to inputs of an OR gate 723 with the output of the gate being applied to the pulse generator 74, for synchronizing the pulse generator with the received code symbol sequence. The 1 line 721 is connected to the 1 input of a flip-flop 700, and the 0 line 722 is connected to the 0 input of the flip-flop 700. Flip-flops 700 through 705 form the respective stages of the storage register 72. Gates 706–710 shift the binary information from the flip-flops 700–705, respectively, to temporary storage stages which comprise flip-flops 711–715, respectively, at pulse Q1 time. At pulse Q2 time, gates 715–720 shift the binary information from the flip-flops 711–715 to storage register stages 701–705, respectively, at pulse Q2 time. The binary states of the flip-flops 700–705 at any instant of time respresent the present state of signal activity of the received code symbol sequence. The decoder 76 is connected to all of the storage register stages for determining the history of the received code symbol sequence, with the output of the decoder 76 being applied to the filter value table 82 illustrated in FIG. 14C. The decoder 80 is connected to the last four stages, that is, flip-flops 702–705 of the storage 72 for providing a history of the received code symbol sequence to the delta value table 84 illustrated in FIG. 14B. The decoder 78 is connected to the stages 701–704 of the storage register 72 for providing a history of the received code symbol sequence to the gain logic network 86.

Figure 14D:
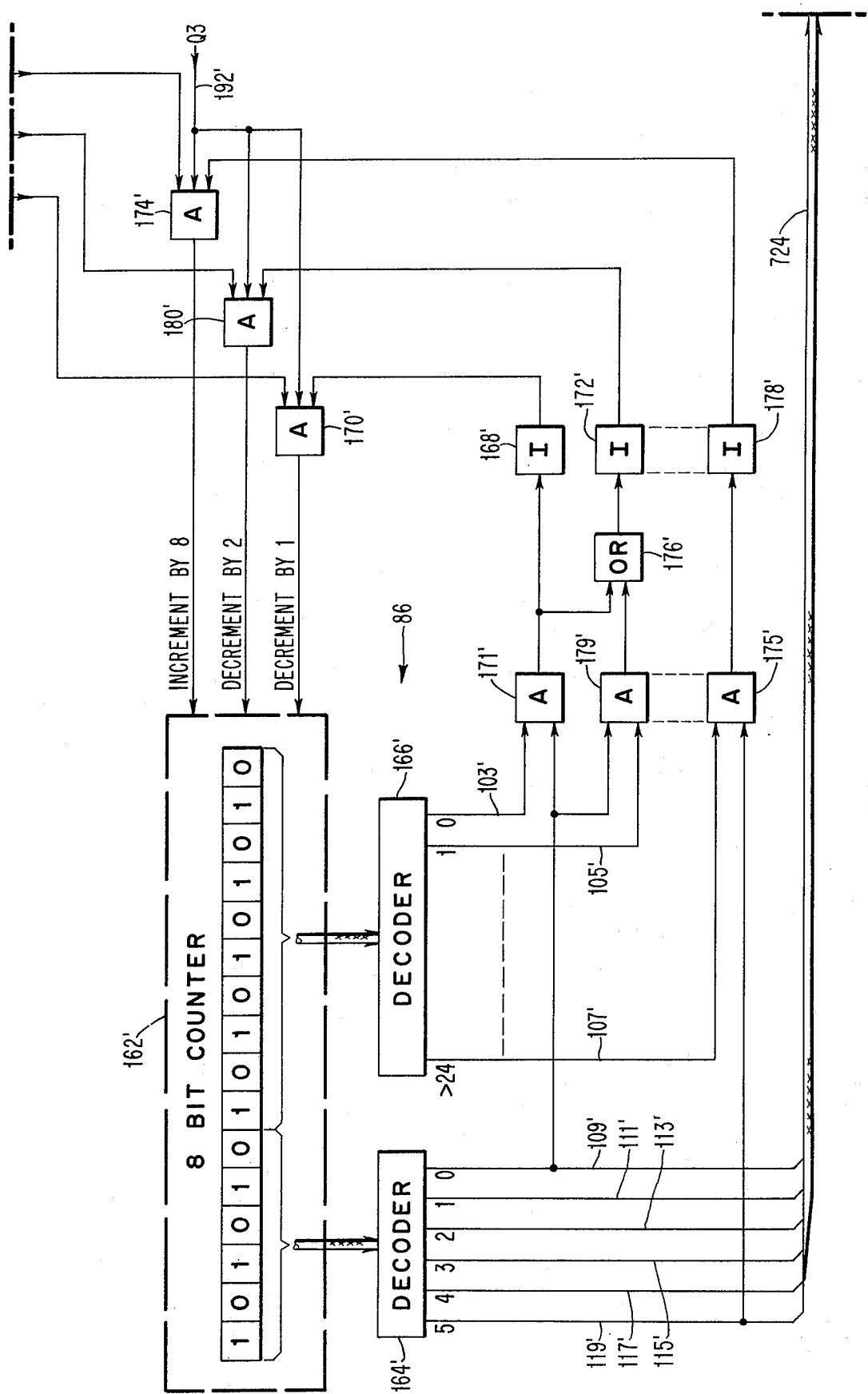

The delta value table 84 and the gates 88 illustrated in FIG. 14B are similar to the delta value table 26 and gates 32 for the encoder portion of the delta modulator set forth in FIG. 5B, so a detailed description of the functioning of these elements isn't repeated. The gates 87 associated with filter value table 82 illustrated in FIG. 14C are similar to the gates 34 illustrated in FIG. 5C, and accordingly a detailed description of the functioning of these gates isn't repeated. The gain logic network 86 illustrated in FIG. 14D is similar to the gain logic network 28 illustrated in FIG. 5D and accordingly a detailed description of its functioning isn't repeated. The filter value table 82 is illustrated in detail in FIG. 15 and its operation is described shortly.

The gain logic network 86 (FIG. 14D) responds to the state of signal activity as represented by the decoded signal at the output of the decoder 78 (FIG. 14A) for selecting a new modification signal at pulse time Q3 when the 8-bit counter 162' is either incremented or decremented or left in its present condition as previously described. The selected modification signal at the output of the decoder 164' is provided on an output line 724 and is applied to the gates 87 and 88, respectively, for providing the multiplication factor for modifying the selected smoothing value and the selected delta increment, respectively.

A complete timing sequence for the decoder 70 is now described for one cycle of system decoding operation. At pulse time Q1 the received code symbol sequence presently stored in the input storage register 72 is shifted from the shift register stages 701–705 to temporary storage stages 711–715, as previously described. At pulse Q2 time, the binary information stored in the temporary storage stages 711–715 are shifted to the storage register stages 701–705 as previously described. At Q2 time the old sum stored in the accumulator 99 is shifted in parallel through the gate 100 to the data register 101 for addition with the modifed selected reference value presently stored in the register 91. At pulse Q3 time the gain logic network 86 responds to the decoded message from the decoder 78 (FIG. 14A) for generating a new modification signal on output line 724 which is applied to the gates 87 and 88, respectively. At pulse Q4 time, the modification signal on line 724 enables a selected one of the gates 121'', 123'', 125'', 127'', 129'' and 131'', and whichever of these gates is enabled by the modification signal modifies the selected delta increment signal from the delta value table 84, and this modified delta increment is applied via the line 90 to the register 91, and is added with the information presently stored in the register 101. At pulse Q5 time, the old sum from the the adder 92 is passed through the gate 94 and stored in the register 101 for forming a new sum output from the adder 92, and this new sum is passed by the gate 95 to the accumulator 99. At pulse Q6 time, a selected one of the gates 121''', 123''', 125''', 127''', 129''', and 131''' is enabled for enabling a selected one of the gates comprising gates 87 for modifying the selected smoothing value from the filter value table 82, with the modified smoothing value being applied via the line 90 to the register 91 for addition with the information presently stored in the register 101. At pulse time Q7 the sum from the adder 92 is passed by the gate 93 to the register 96 to a digital analog converter 97 with the reconstructured analog signal, which is a representation of the input signal set forth in FIG. 1 and FIG. 5 being applied to the analog receiver 98. This timing sequence repeats for the duration of system operation.

Refer to FIG. 15, which is a detailed showing of the filter value table 82 as illustrated in FIG. 14C. The filter value table responds to the decoded message output from the decoder 76 for providing a smoothing value for the decoded delta increment, with the smoothing value being selected in accordance with the state of signal activity of the received code symbol sequence. The smoothing values are one of a plurality of positive or negative integers in 2's complement configuration which are selected by a gating process to be described below. With reference to FIG. 15A, when the decoded signal has a signal state represented by the binary configuration 0 0 0 0 0 0, a gate 731 is enabled for passing the integer value −92, which is stored in a storage register 730. This signal is applied to the gates 87 for modification as previously described. A gate 733 passes the integer value −8 stored in the register 732 whenever the decoded message has a binary configuration of 0 0 0 1 1 1. The binary configurations and associated gates and registers situated between the registers 730 and 732 operate in a similar manner.

Figure 15A:
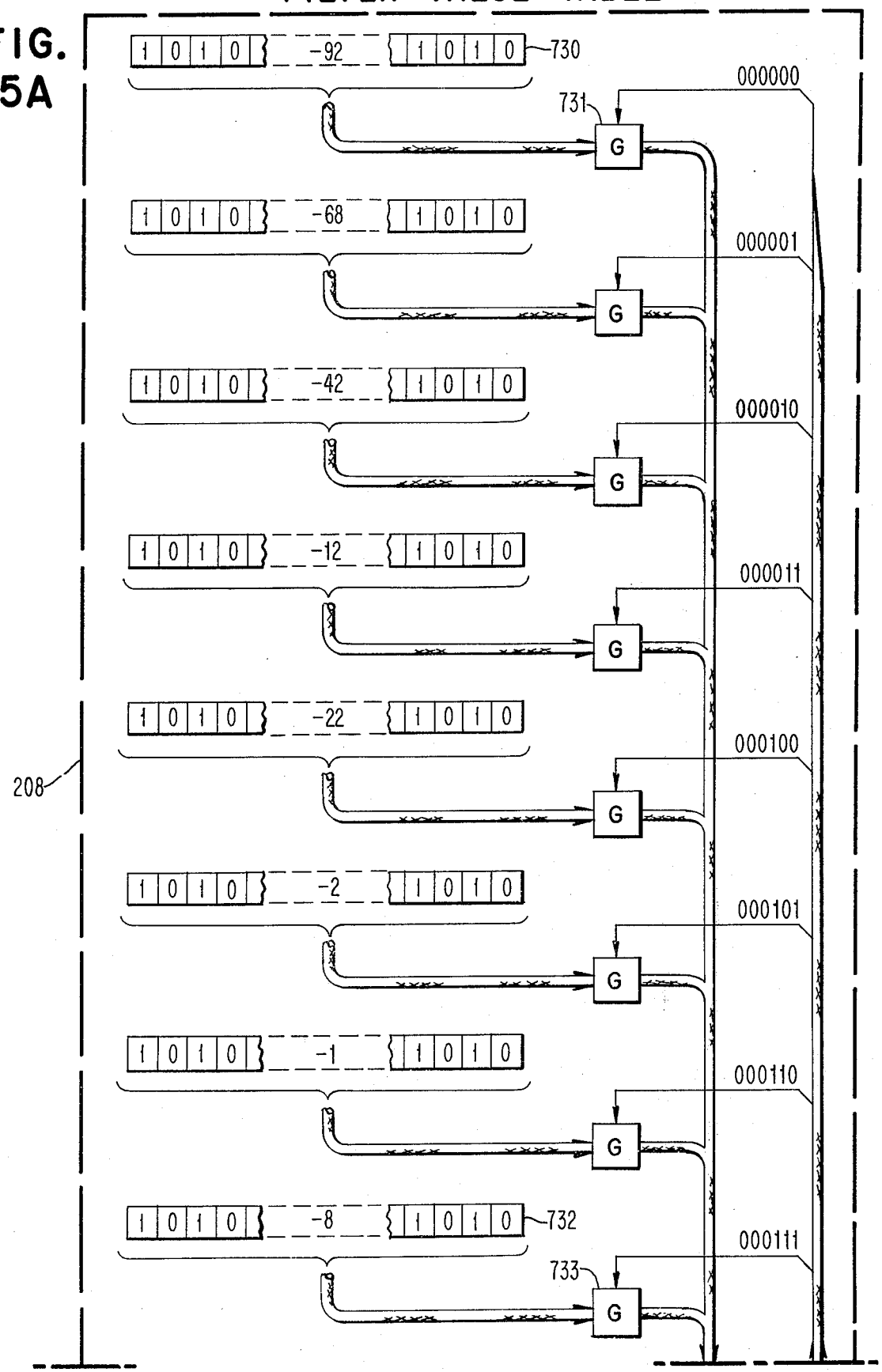
FIGS. 15A, 15B, 15C, 15D, 15E, 15F, 15G and 15H taken together as shown in FIG. 15 is a block diagram representation of the filter value table illustrated in FIG. 14C.
Figure 15B:
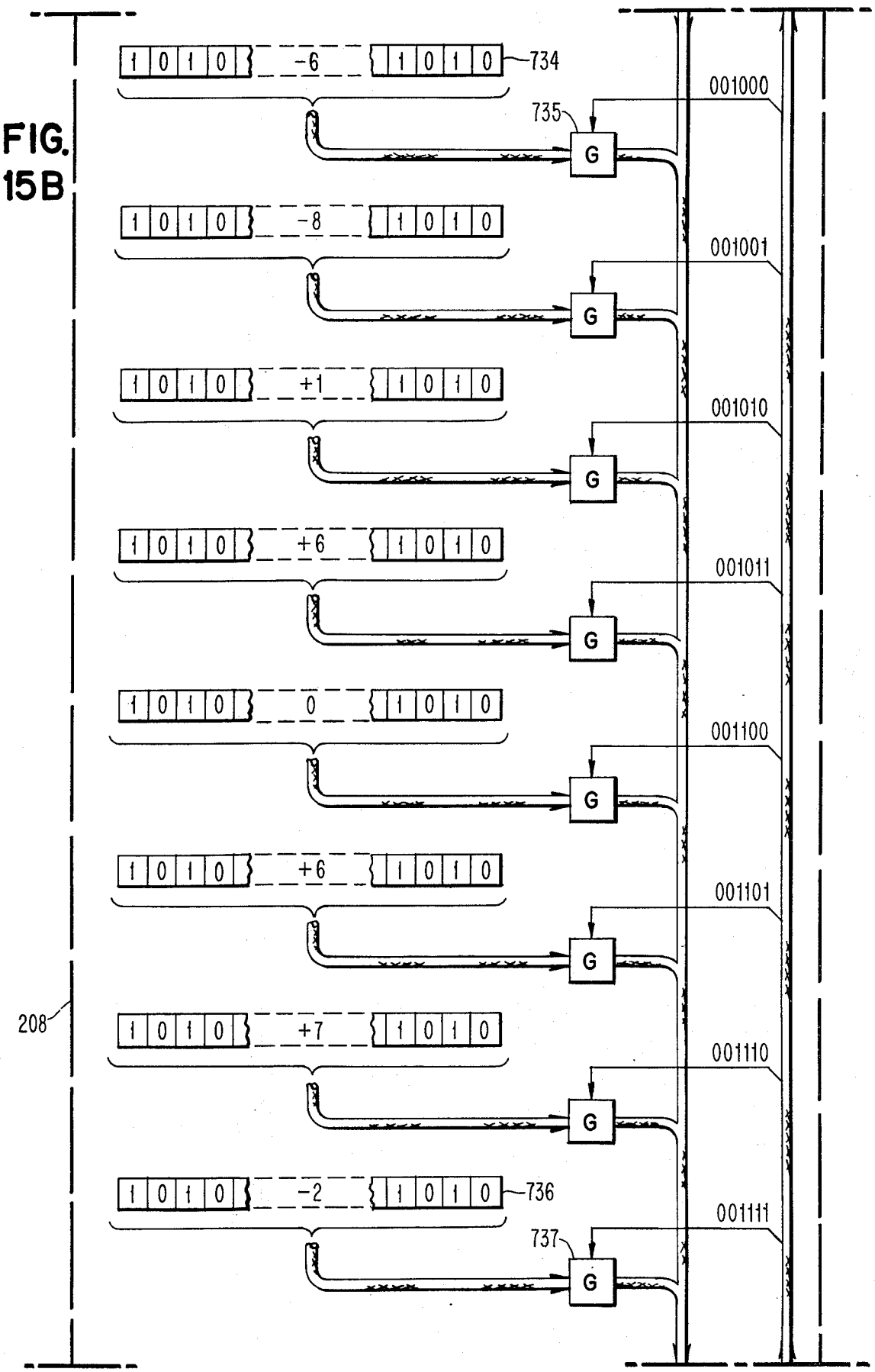

FIG. 15B illustrates another portion of the reference value table, with a gate 735 being enabled when the binary configuration 0 0 1 0 0 0 is present, which allows the integer value −6 which is stored in the register 734 to be applied to the gates 87 for modification. A gate 737 passes the integer value −2 stored in a register 736 when the decoded binary configuration is 0 0 1 1 1 1. The registers and gates situated intermediate the registers 734 and 736 operate in a similar manner.

Figure 15C:
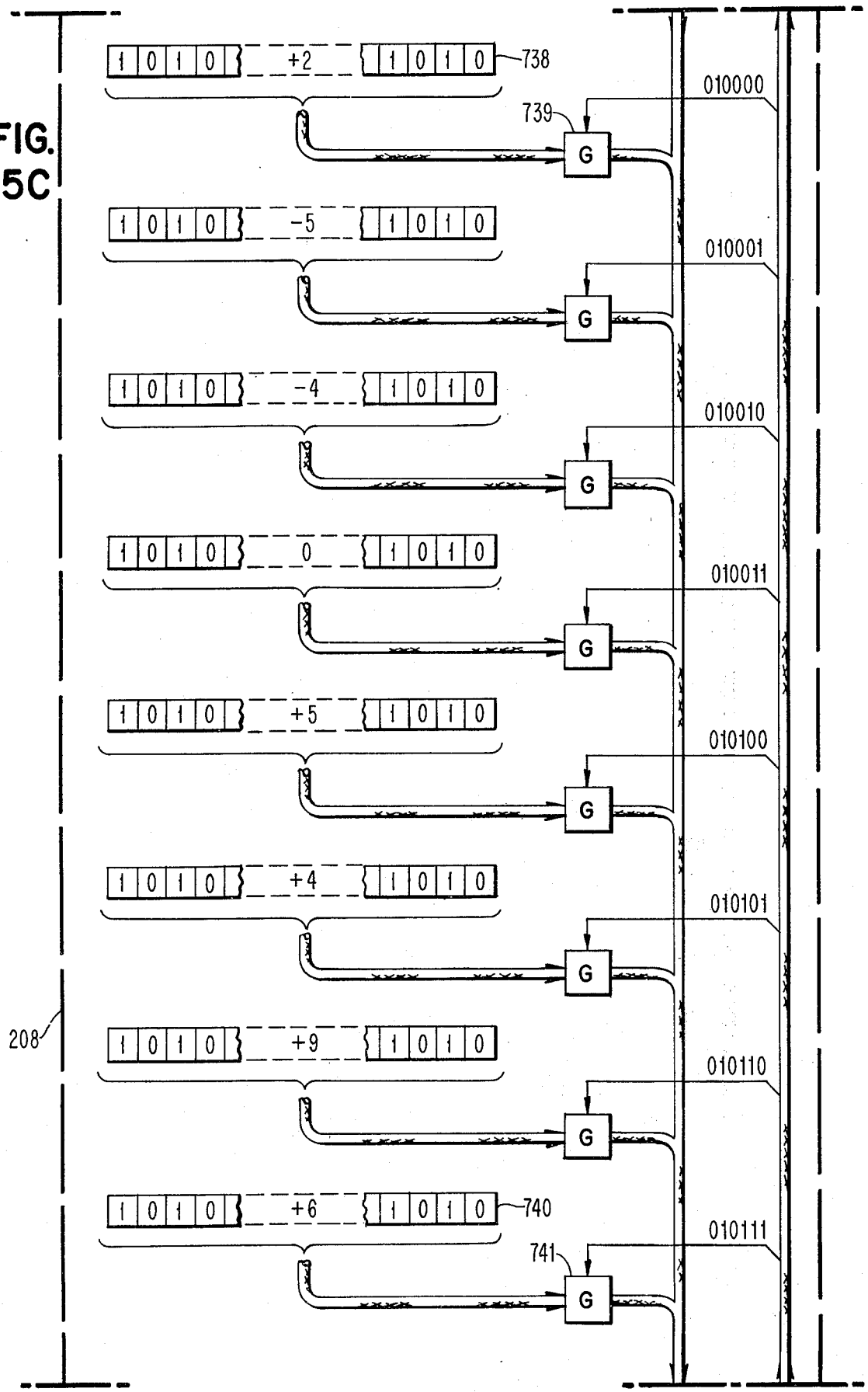

In FIG. 15C another portion of the filter value table is illustrated with the gate 739 being enabled when a binary configuration of 0 1 0 0 0 0 is sensed, which permits an integer value of +2 to be passed from the storage register 738 to the gate 86. A gate 741 is enabled when the binary configuration 0 1 0 1 1 1 is sensed, permitting the integer value of +6 stored in a register 740 to be applied to the gates 87. The gates and associated registers situated intermediate the registers 738 and 740 operate in a similar manner.

Figure 15D:
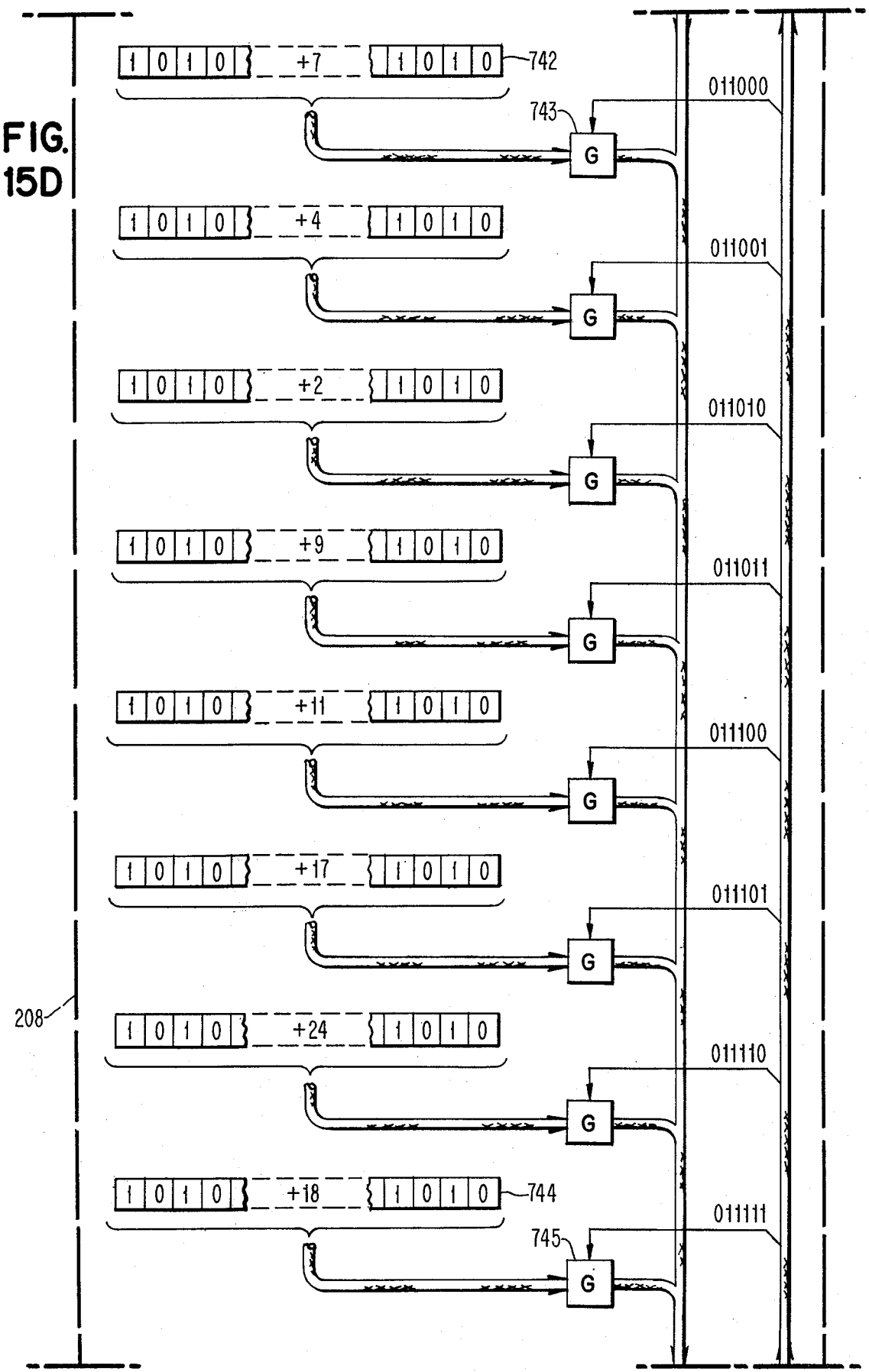

FIG. 15D illustrates another portion of the filter value table 82, with the gate 743 being enabled in response to the decoded message having a binary configuration of 0 1 1 0 0 0, for passing the reference integer value +7 from the storage register 742 to the gates 87. A gate 745 is enabled in response to the decoded binary configuration of 0 1 1 1 1 1, for passing the positive integer value +18 from the storage register 744 to the gates 87. The gates and storage register stages intermediate the storage registers 742 and 744 operate in a similar manner.

Figure 15E:
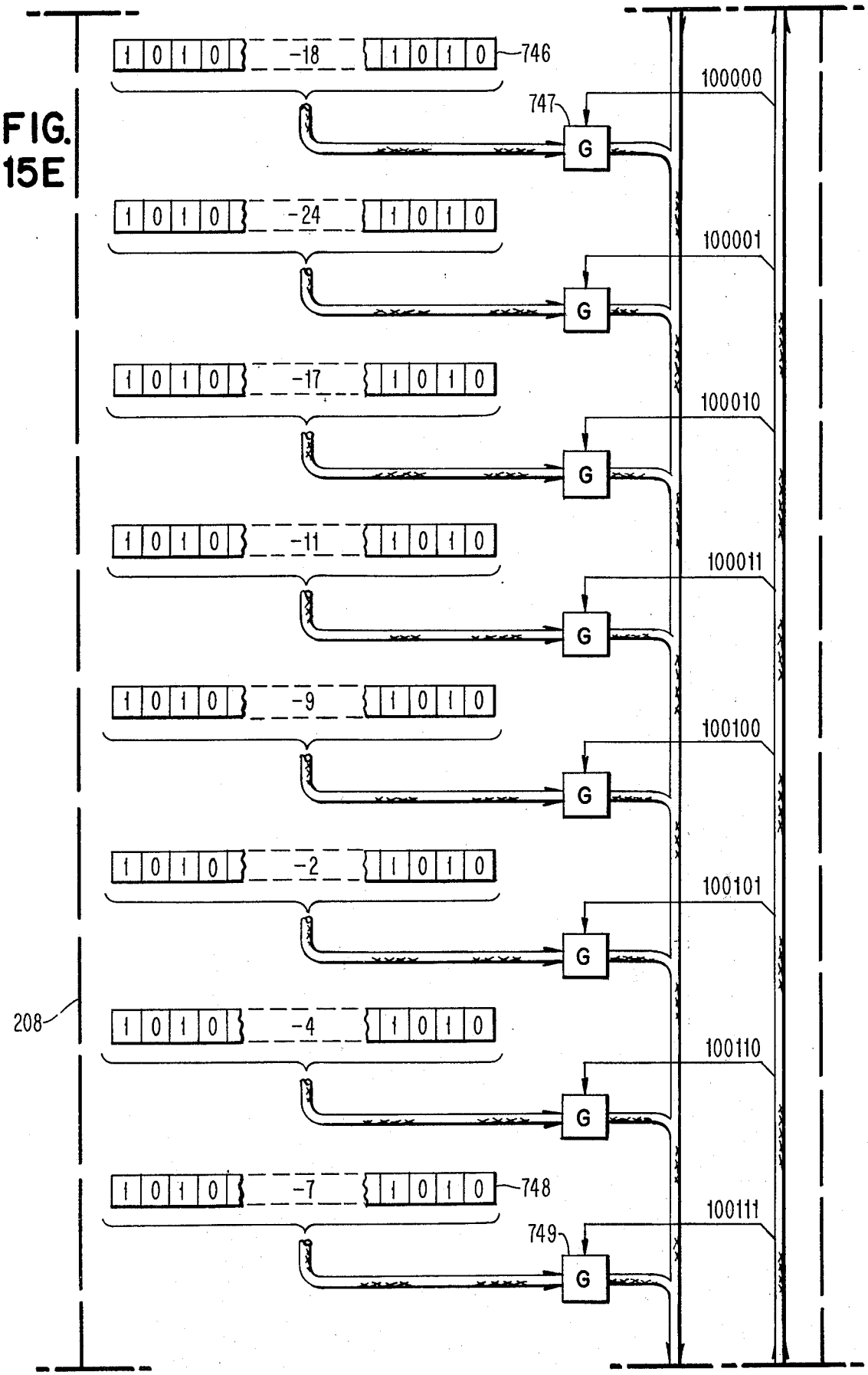

FIG. 15E illustrates another portion of the filter value table 82 with the gate 747 being enabled in response to the binary configuration 1 0 0 0 0 0 for passing the integer value −18 from the storage register 746 to the gates 87. A gate 749 is enabled in response to the binary configuration 1 0 0 1 1 1 for passing the integer value −7 from the storage register 748 to the gates 87. The gates and storage register stages intermediate the storage registers 746 and 748 operate in a similar manner.

Figure 15F:
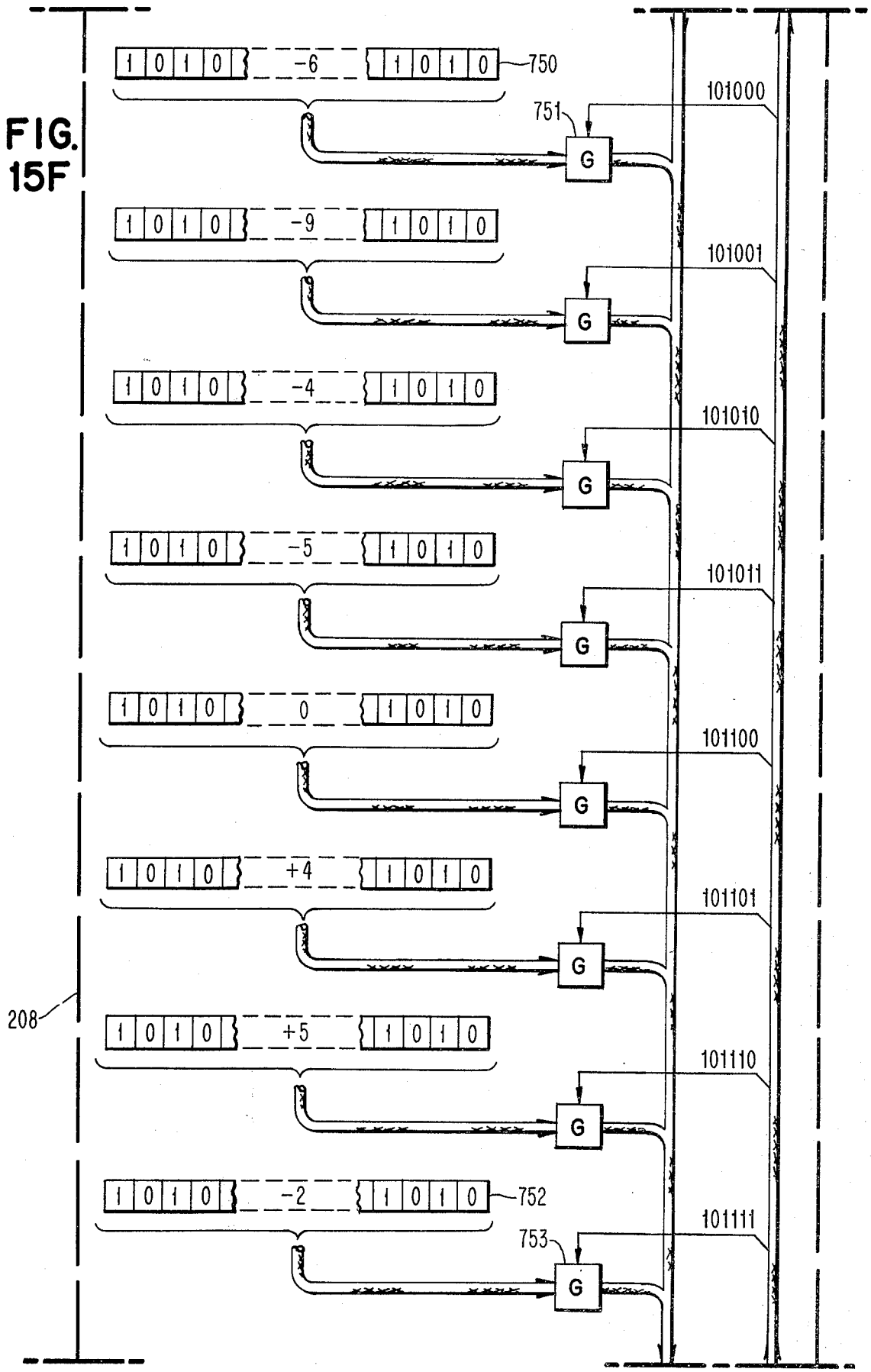

FIG. 15F illustrates yet another portion of the filter value table 82. A gate 751 is enabled in response to the provision of the binary configuration 1 0 1 0 0 0 for passing the integer value −6 from the storage register 750 to the gates 87. A gate 753 is enabled in response to the provision of the binary configuration 1 0 1 1 1 1 for passing the integer value −2 from the register 752 to the gates 87. The gates and register stages intermediate the registers 750 and 752 operate in a similar manner.

Figure 15G:
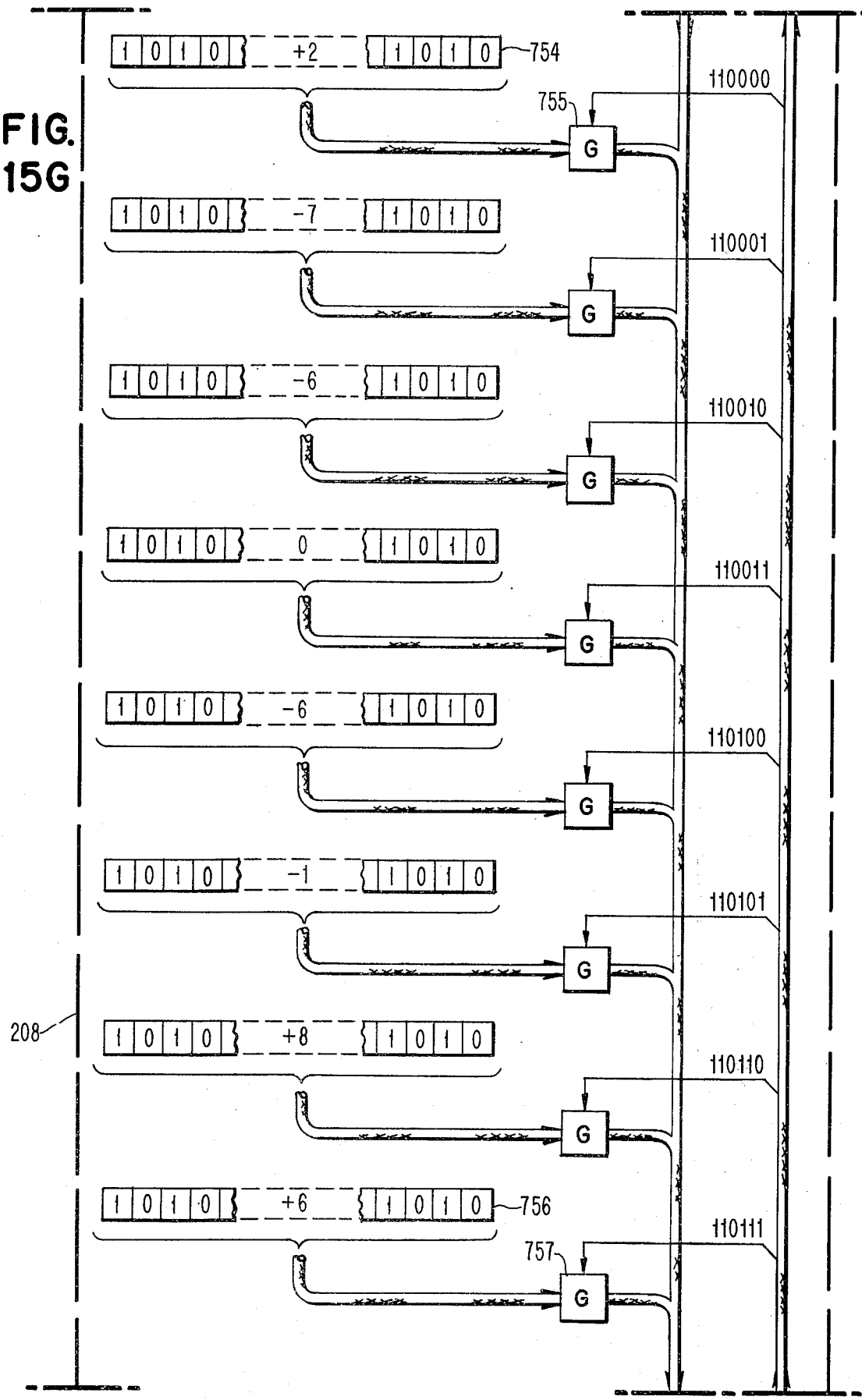

FIG. 15G illustrates another portion of the filter value table 82, with the gate 755 being enabled in response to the binary configuration 1 1 0 0 0 0 for passing the integer value +2 from the storage register 754 to the gates 87. A gate 757 is enabled in response to the binary configuration 1 1 0 1 1 1 for passing the integer value +6 from the storage register 756 to the gate 87. The gates and registers intermediate the register stages 754 and 756 operate in a similar manner.

Figure 15H:
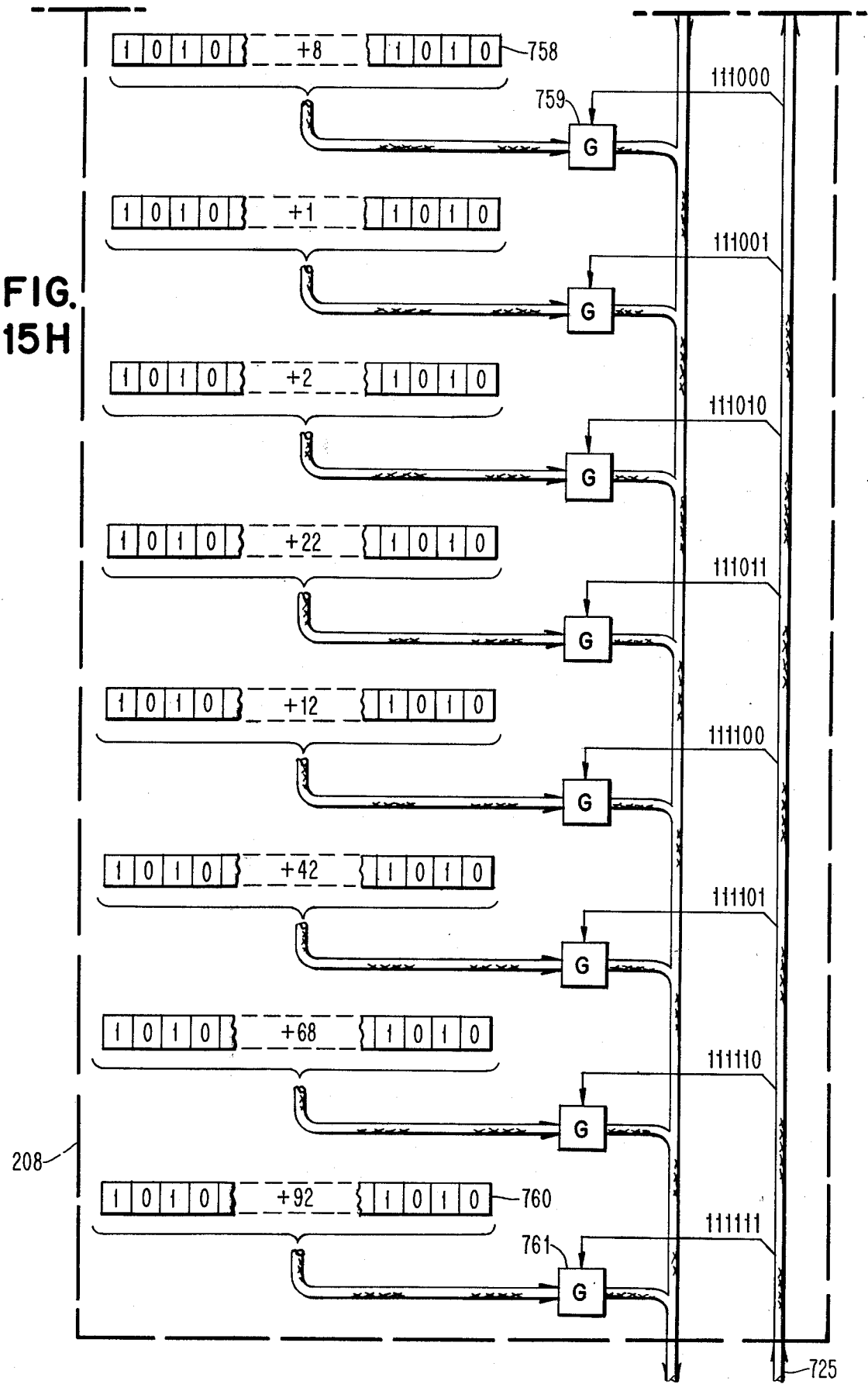

Another portion of the filter value table 82 is illustrated in FIG. 15H with a gate 759 being enabled in response to the binary configuration 1 1 1 0 0 0 for passing the integer value +8 from the storage register 758 to the gates 87. A gate 761 is enabled in response to the provision of the binary configuration 1 1 1 1 1 1 for passing the integer value +92 from the storage register 760 to the gates 87. The gates and storage register stages intermediate the registers 758 and 760 operate in a similar manner.

In summary, a delta modulator has been disclosed which generates code symbols representing increments of signal level, with each code symbol being determined in accordance with the difference in signal level between an input signal and a prediction signal, which is a representation of the input signal, with the prediction signal being formed by accumulation of successive signal level increments which depend on the history of the code symbols. THere is means for storing a sequence of generated code symbols, with the sequence including the most recent code symbol and a given number of preceding code symbols, with the patttern of code symbols at any instant defining the state of signal activity. There is also means for producing three signals in accordance with the state of signal activity represented by the stored code symbol pattern, namely in incremental signal level, a threshold value and a modifier signal. Further, there is means for modifying the incremental signal level and the threshold value an amount determined by the modifier signal. Finally, there is means for forming a new prediction signal by accumulation of successive modified signal level increments which are summed with successive modified threshold values, including means for generating a new code symbol in response to comparing the new prediction signal with the input signal.

What is claimed is:

1. In a delta modulator, a method of generating and then decoding code symbols representing increments of signal level, with each code symbol being determined in accordance with the difference in signal level between an input signal and a prediction signal which is a representation of said input signal, with said prediction signal being formed by accumulation of successive signal increments which depend on the history of said code symbols, said method comprising the steps of:
   storing a sequence of generated code symbols, said sequence including the most recent code symbol and a given number of preceding code symbols, with the pattern of stored code symbols at any instant defining a state of signal activity;
   selecting three signals in accordance with the state of signal activity represented by the stored code symbol pattern, namely an incremental signal level, a threshold value and a modifier signal;
   modifying said incremental signal level and said threshold value an amount determined by said modifier signal;
   forming a new prediction signal by accumulation of successive modified signal level increments which are summed with successive modified threshold values; and
   generating a new code symbol in response to comparing said new prediction signal with said input signal;
   said method including the steps of decoding comprising:
   storing a sequence of said code symbols, said sequence including the most recent code symbol and a given number of preceding code symbols, with the pattern of code symbols at any instant defining a state of signal activity;
   selecting an incremental signal level in accordance with the state of signal activity represented by the stored code signal pattern;
   selecting a smoothing value in accordance with the state of signal activity represented by the stored code signal pattern;
   selecting a multiplier signal, having an integer value, in accordance with the state of signal activity represented by the stored code signal pattern;
   multiplying said incremental signal level and said smoothing value by the selected multiplier signal; and
   forming a decoded signal in response to accumulating successive multiplied signal level increments which are summed with successive multiplied smoothing values.

2. In a delta modulator, a method of generating and then decoding binary code signal representing increments of signal level, with a given binary code signal having one binary state when an analog input signal has a signal level greater than or equal to the signal level of an analog prediction signal, and with said given binary code signal having the other binary state when said analog input signal has a signal level which is less than the signal level of said analog prediction signal, with said analog prediction signal being formed by accumulation of successive signal increments which depend on the history of said binary code signals, said method comprising the steps of:
   storing a sequence of generated binary code signals, said sequence including the most recent binary code signal and a given number of preceding binary code signals, with the pattern of binary code signals at any instant defining a state of signal activity;

selecting a binary coded incremental signal level in accordance with the state of signal activity represented by the stored binary code signal pattern;

selecting a binary coded threshold value in accordance with the state of signal activity represented by the stored binary code signal pattern;

selecting a binary coded modifier signal in accordance with the state of signal activity represented by the stored binary code signal pattern;

modifying the respective binary bit patterns of said binary coded incremental signal level and said binary coded threshold value in accordance with the binary bit pattern of said binary coded modifier signal;

forming a binary coded prediction signal by accumulation of successive modified binary coded incremental signal levels which are summed with successive modified binary coded threshold values;

converting said binary coded prediction signal to an analog prediction signal; and generating a new binary code signal in response to comparing said analog input signal with said analog prediction signal;

said method including the steps of decoding comprising:

storing a sequence of the generated binary code symbols, said sequence including the most recent binary code symbol and a given number of preceding binary code symbols, with the pattern of stored binary code symbols at any given instant defining a state of signal activity;

selecting a binary coded incremental signal level in accordance with the state of signal activity represented by the stored sequence of the generated binary code symbols;

selecting a binary coded smoothing value is accordance with the state of signal activity represented by the stored sequence of the generated binary code symbols;

selecting a binary coded modifier signal in accordance with the state of signal activity represented by the stored sequence of the generated binary code symbols;

modifying the respective binary bit patterns of said binary coded incremental signal level and said binary coded smoothing value in accordance with the binary bit pattern of said binary coded modifier signal; and forming a decoded binary signal in response to accumulating successive modified binary coded incremental signal levels which are summed with successive modified binary coded smoothing values.

3. The method of claim 2, including the step of:

converting said decoded binary signal to an analog signal.

4. In a delta modulator and demodulator for generating and then decoding, respectively, code symbols representing increments of signal level, with each code symbol being determined in accordance with the difference in signal level between an input signal and a prediction signal which is a representation of said input signal, with said prediction signal being formed by accumulation of successive signal level increments which depend on the history of said code symbols, the combination comprising:

means for storing a sequence of generated code symbols, said sequence including the most recent code symbol and a given number of preceding code symbols, with the pattern of stored code symbols at any instant defining a state of signal activity;

means for selecting an incremental signal level in accordance with the state of signal activity represented by the stored code signal pattern;

means for selecting a threshold value in accordance with the state of signal activity represented by the stored code signal pattern;

means for selecting a multiplier signal in accordance with the state of signal activity represented by the stored code signal pattern;

means for multiplying said incremental signal level and said threshold value by the selected multiplier signal;

means for forming a new prediction signal by accumulation of successive multiplied signal level increments which are summed with successive multiplied threshold values; and means for generating a new code symbol in response to comparing said new prediction signal with said input signal;

said delta demodulator including:

means for storing a sequence of said generated code symbols, said sequence including the most recent code symbol and a given number of preceding code symbols, with the pattern of code symbols at any instant defining a state of signal activity;

means for selecting an incremental signal level in accordance with the state of signal activity represented by the stored code signal pattern;

means for selecting a smoothing value in accordance with the state of signal activity represented by the stored code signal pattern;

means for selecting a multiplier signal in accordance with the state of signal activity represented by the stored code signal pattern;

means for multiplying said incremental signal level and said smoothing value by the selected multiplier signal; and means for generating a decoded signal which is a representation of said input signal in response to accumulating successive multiplied signal level increments which are summed with successive multiplied smoothing values.

* * * * *